(12) United States Patent
Curtis et al.

(10) Patent No.: US 8,782,525 B2
(45) Date of Patent: Jul. 15, 2014

(54) DISPLAYING PHYSICAL SIGNAL ROUTING IN A DIAGRAM OF A SYSTEM

(75) Inventors: Matthew C. Curtis, Leander, TX (US); Jenifer M. Loy, Austin, TX (US); Adam K. Gabbert, Austin, TX (US); Jayson P. Ryckman, Austin, TX (US); Jacob Kornerup, Austin, TX (US); Jeffrey N. Correll, Cedar Park, TX (US); Timothy J. Hayles, Austin, TX (US)

(73) Assignee: National Insturments Corporation, Austin, TX (US)

(*) Notice: Subject to any disclaimer, the term of this patent is extended or adjusted under 35 U.S.C. 154(b) by 278 days.

(21) Appl. No.: 13/193,133

(22) Filed: Jul. 28, 2011

(65) Prior Publication Data

US 2013/0031509 A1    Jan. 31, 2013

(51) Int. Cl.
*G06F 15/177* (2006.01)

(52) U.S. Cl.
USPC ........... 715/736; 715/735; 715/823; 715/854; 715/855; 715/860

(58) Field of Classification Search
USPC .......... 715/810, 736, 735, 823, 854, 855, 860
See application file for complete search history.

(56) References Cited

U.S. PATENT DOCUMENTS

| | | | |
|---|---|---|---|
| 4,445,169 A * | 4/1984 | Wakita et al. | 700/18 |
| 4,812,996 A | 3/1989 | Stubbs | |
| 4,852,047 A * | 7/1989 | Lavallee et al. | 700/86 |
| 4,868,785 A | 9/1989 | Jordan et al. | |
| 4,884,228 A | 11/1989 | Stanley et al. | |
| 4,914,568 A * | 4/1990 | Kodosky et al. | 715/763 |
| 4,942,514 A * | 7/1990 | Miyagaki et al. | 700/85 |
| 4,970,664 A * | 11/1990 | Kaiser et al. | 715/804 |
| 5,136,705 A | 8/1992 | Stubbs et al. | |
| 5,155,836 A | 10/1992 | Jordan et al. | |
| 5,157,668 A * | 10/1992 | Buenzli et al. | 714/26 |
| 5,237,691 A | 8/1993 | Robinson et al. | |
| 5,261,044 A | 11/1993 | Dev et al. | |

(Continued)

FOREIGN PATENT DOCUMENTS

EP    0727740 A3    8/1996

OTHER PUBLICATIONS

Bing search q=eternus+sf+storage+cruiser&qs=n&fo Jan. 31, 2014.*
Bing search q=hardware+route+software&qs=n&form=Feb. 28, 2014.*

(Continued)

*Primary Examiner* — Boris Pesin
*Assistant Examiner* — John Heffington
(74) *Attorney, Agent, or Firm* — Meyertons Hood Kivlin Kowert & Goetzel, P.C.; Jeffrey C. Hood; Joel L. Stevens

(57) ABSTRACT

Displaying physical signal routing of a system. A diagram of the system may be displayed. The system may include physical components connected via physical connections and logical components implemented on various ones of the physical components. The diagram may include a plurality of icons connected by wires. At least a first subset of the icons may represent logical elements of the system and wires between the first subset of icons may represent logical connections between corresponding logical elements. User input requesting signal routing information of the system may be received. In response, a signal route corresponding to a first logical connection between a first logical element and a second logical element may be visually indicated.

26 Claims, 17 Drawing Sheets

(56) References Cited

U.S. PATENT DOCUMENTS

| | | | |
|---|---|---|---|
| 5,301,301 A | 4/1994 | Kodosky et al. | |
| 5,309,352 A | 5/1994 | Stubbs | |
| 5,327,161 A | 7/1994 | Logan et al. | |
| 5,386,566 A * | 1/1995 | Hamanaka et al. | 719/310 |
| 5,481,741 A | 1/1996 | McKaskle et al. | |
| 5,493,507 A * | 2/1996 | Shinde et al. | 703/14 |
| 5,522,022 A | 5/1996 | Rao et al. | |
| 5,543,590 A | 8/1996 | Gillespie et al. | |
| 5,543,591 A | 8/1996 | Gillespie et al. | |
| 5,592,881 A * | 1/1997 | Rabjohns | 101/483 |
| 5,630,164 A | 5/1997 | Williams et al. | |
| 5,644,728 A | 7/1997 | Pillans | |
| 5,764,218 A | 6/1998 | Della Bona et al. | |
| 5,764,281 A | 6/1998 | Seo | |
| 5,801,942 A | 9/1998 | Nixon et al. | |
| 5,805,166 A | 9/1998 | Hall, Jr. et al. | |
| 5,812,394 A | 9/1998 | Lewis et al. | |
| 5,815,405 A * | 9/1998 | Baxter | 716/103 |
| 5,825,352 A | 10/1998 | Bisset et al. | |
| 5,828,851 A | 10/1998 | Nixon et al. | |
| 5,838,563 A | 11/1998 | Dove et al. | |
| 5,844,415 A | 12/1998 | Gershenfeld et al. | |
| 5,861,882 A | 1/1999 | Sprenger et al. | |
| 5,880,411 A | 3/1999 | Gillespie et al. | |
| 5,880,717 A | 3/1999 | Chan et al. | |
| 5,914,610 A | 6/1999 | Gershenfeld et al. | |
| 5,936,412 A | 8/1999 | Gershenfeld et al. | |
| 5,943,043 A | 8/1999 | Furuhata et al. | |
| 5,991,537 A | 11/1999 | McKeon et al. | |
| 6,025,726 A | 2/2000 | Gershenfeld et al. | |
| 6,028,271 A | 2/2000 | Gillespie et al. | |
| 6,051,981 A | 4/2000 | Gershenfeld et al. | |
| 6,064,816 A | 5/2000 | Parthasarathy et al. | |
| 6,066,954 A | 5/2000 | Gershenfeld et al. | |
| 6,078,320 A | 6/2000 | Dove et al. | |
| 6,098,028 A | 8/2000 | Zwan et al. | |
| 6,102,965 A | 8/2000 | Dye et al. | |
| 6,173,438 B1 | 1/2001 | Kodosky et al. | |
| 6,219,628 B1 | 4/2001 | Kodosky et al. | |
| 6,243,861 B1 | 6/2001 | Nitta et al. | |
| 6,323,846 B1 | 11/2001 | Westerman et al. | |
| 6,380,931 B1 | 4/2002 | Gillespie et al. | |
| 6,380,951 B1 * | 4/2002 | Petchenkine et al. | 715/736 |
| 6,396,523 B1 | 5/2002 | Segal et al. | |
| 6,414,671 B1 | 7/2002 | Gillespie et al. | |
| 6,437,805 B1 | 8/2002 | Sojoodi et al. | |
| 6,457,165 B1 * | 9/2002 | Ishikawa et al. | 716/126 |
| 6,526,566 B1 | 2/2003 | Austin | |
| 6,610,936 B2 | 8/2003 | Gillespie et al. | |
| 6,615,088 B1 | 9/2003 | Myer et al. | |
| 6,629,123 B1 | 9/2003 | Hunt | |
| 6,639,584 B1 | 10/2003 | Li | |
| 6,750,852 B2 | 6/2004 | Gillespie et al. | |
| 6,772,017 B1 * | 8/2004 | Dove et al. | 700/18 |
| 6,789,090 B1 | 9/2004 | Miyake et al. | |
| 6,856,259 B1 | 2/2005 | Sharp | |
| 6,876,368 B2 | 4/2005 | Dove et al. | |
| 6,888,536 B2 | 5/2005 | Westerman et al. | |
| 6,933,929 B1 | 8/2005 | Novak | |
| 7,010,362 B2 * | 3/2006 | Dove et al. | 700/18 |
| 7,028,222 B2 | 4/2006 | Peterson et al. | |
| 7,030,860 B1 | 4/2006 | Hsu et al. | |
| 7,030,861 B1 | 4/2006 | Westerman et al. | |
| 7,042,464 B1 | 5/2006 | Paquette | |
| 7,046,230 B2 | 5/2006 | Zadesky et al. | |
| 7,062,718 B2 * | 6/2006 | Kodosky et al. | 715/771 |
| 7,076,688 B2 * | 7/2006 | Yamamoto | 714/6.1 |
| 7,093,005 B2 | 8/2006 | Patterson | |
| 7,109,978 B2 | 9/2006 | Gillespie et al. | |
| 7,178,123 B2 | 2/2007 | Lin et al. | |
| 7,180,506 B2 | 2/2007 | Lin et al. | |
| 7,184,031 B2 | 2/2007 | Lin et al. | |
| 7,185,287 B2 | 2/2007 | Ghericioiu et al. | |
| 7,188,201 B2 * | 3/2007 | Harima et al. | 710/104 |
| 7,190,356 B2 | 3/2007 | Lin et al. | |
| 7,200,817 B2 | 4/2007 | Dove et al. | |
| 7,219,208 B2 * | 5/2007 | Nagashima et al. | 711/170 |
| 7,222,172 B2 * | 5/2007 | Arakawa et al. | 709/224 |
| 7,287,116 B2 * | 10/2007 | Iwami et al. | 711/6 |
| 7,290,244 B2 | 10/2007 | Peck et al. | |
| 7,302,506 B2 * | 11/2007 | Harima et al. | 710/104 |
| 7,312,785 B2 | 12/2007 | Tsuk et al. | |
| 7,333,092 B2 | 2/2008 | Zadesky et al. | |
| RE40,153 E | 3/2008 | Westerman et al. | |
| 7,339,580 B2 | 3/2008 | Westerman et al. | |
| 7,346,924 B2 * | 3/2008 | Miyawaki et al. | 726/6 |
| 7,348,967 B2 | 3/2008 | Zadesky et al. | |
| 7,358,963 B2 | 4/2008 | Low et al. | |
| 7,370,229 B2 * | 5/2008 | Ohno et al. | 714/6.1 |
| 7,406,622 B2 * | 7/2008 | Yamamoto et al. | 714/6.1 |
| 7,450,113 B2 | 11/2008 | Gillespie et al. | |
| 7,451,606 B2 * | 11/2008 | Harrod | 62/77 |
| 7,457,916 B2 * | 11/2008 | Suzuki et al. | 711/114 |
| 7,469,289 B2 * | 12/2008 | Arakawa et al. | 709/224 |
| 7,469,381 B2 | 12/2008 | Ording | |
| 7,474,929 B2 * | 1/2009 | Nixon et al. | 700/83 |
| 7,479,949 B2 | 1/2009 | Jobs et al. | |
| 7,495,659 B2 | 2/2009 | Marriott et al. | |
| 7,499,040 B2 | 3/2009 | Zadesky et al. | |
| 7,509,588 B2 | 3/2009 | Van Os et al. | |
| 7,532,205 B2 | 5/2009 | Gillespie et al. | |
| 7,564,449 B2 | 7/2009 | Layton et al. | |
| 7,576,732 B2 | 8/2009 | Lii | |
| 7,610,508 B2 * | 10/2009 | Ohno et al. | 714/6.1 |
| 7,657,778 B2 * | 2/2010 | Goto et al. | 714/3 |
| 7,701,447 B2 | 4/2010 | Lii et al. | |
| 7,702,823 B2 * | 4/2010 | Hosoya et al. | 710/15 |
| 7,707,199 B2 * | 4/2010 | Shinohara et al. | 707/705 |
| 7,719,523 B2 | 5/2010 | Hillis | |
| 7,728,821 B2 | 6/2010 | Hillis et al. | |
| 7,761,802 B2 | 7/2010 | Shah et al. | |
| 7,770,136 B2 | 8/2010 | Beeck et al. | |
| 7,804,490 B2 | 9/2010 | Chien et al. | |
| 7,822,894 B2 * | 10/2010 | Harima et al. | 710/104 |
| 7,826,359 B2 * | 11/2010 | Tripathi et al. | 370/230 |
| 7,831,914 B2 * | 11/2010 | Kodosky et al. | 715/735 |
| 7,880,720 B2 | 2/2011 | Hill et al. | |
| 7,907,124 B2 | 3/2011 | Hillis et al. | |
| 7,907,125 B2 | 3/2011 | Weiss et al. | |
| 7,911,456 B2 | 3/2011 | Gillespie et al. | |
| 7,949,892 B2 * | 5/2011 | Goto et al. | 714/3 |
| 7,954,003 B2 * | 5/2011 | Ikeda et al. | 711/162 |
| 8,069,278 B2 * | 11/2011 | Itoh | 710/15 |
| 8,201,225 B2 * | 6/2012 | Matsumoto et al. | 726/4 |
| 8,285,499 B2 | 10/2012 | Moore et al. | |
| 2002/0188527 A1 * | 12/2002 | Dillard et al. | 705/27 |
| 2003/0035009 A1 | 2/2003 | Kodosky et al. | |
| 2003/0035416 A1 * | 2/2003 | Zirojevic et al. | 370/357 |
| 2003/0035417 A1 * | 2/2003 | Zirojevic et al. | 370/357 |
| 2003/0043757 A1 * | 3/2003 | White | 370/254 |
| 2003/0046004 A1 * | 3/2003 | White et al. | 702/1 |
| 2003/0046345 A1 * | 3/2003 | Wada et al. | 709/205 |
| 2003/0046657 A1 * | 3/2003 | White | 717/105 |
| 2003/0088852 A1 | 5/2003 | Lacas et al. | |
| 2003/0107599 A1 | 6/2003 | Fuller et al. | |
| 2004/0073683 A1 * | 4/2004 | Beck et al. | 709/227 |
| 2004/0168107 A1 * | 8/2004 | Sharp et al. | 714/33 |
| 2005/0010307 A1 * | 1/2005 | Dove et al. | 700/18 |
| 2005/0232256 A1 * | 10/2005 | White et al. | 370/360 |
| 2005/0235290 A1 | 10/2005 | Jefferson et al. | |
| 2005/0257195 A1 | 11/2005 | Morrow et al. | |
| 2006/0026521 A1 | 2/2006 | Hotelling et al. | |
| 2006/0036799 A1 | 2/2006 | Shah et al. | |
| 2006/0041859 A1 | 2/2006 | Vrancic et al. | |
| 2006/0156251 A1 * | 7/2006 | Suhail et al. | 715/809 |
| 2006/0178858 A1 * | 8/2006 | Trowbridge et al. | 703/2 |
| 2007/0032207 A1 * | 2/2007 | Shah | 455/111 |
| 2007/0038983 A1 * | 2/2007 | Stienhans | 717/127 |
| 2007/0044030 A1 | 2/2007 | Hayles | |
| 2007/0088865 A1 | 4/2007 | Breyer | |
| 2007/0168943 A1 | 7/2007 | Marini et al. | |

(56) References Cited

U.S. PATENT DOCUMENTS

| | | | |
|---|---|---|---|
| 2007/0177803 | A1 | 8/2007 | Elias et al. |
| 2007/0179645 | A1* | 8/2007 | Nixon et al. .................. 700/83 |
| 2008/0028338 | A1 | 1/2008 | Kodosky et al. |
| 2008/0034299 | A1 | 2/2008 | Hayles et al. |
| 2008/0168405 | A1 | 7/2008 | Tolmasky et al. |
| 2008/0292265 | A1* | 11/2008 | Worthen ..................... 386/52 |
| 2008/0295130 | A1* | 11/2008 | Worthen ..................... 725/34 |
| 2008/0301142 | A1* | 12/2008 | Marolf ......................... 707/9 |
| 2008/0312757 | A9* | 12/2008 | Nixon et al. .................. 700/83 |
| 2009/0006147 | A1* | 1/2009 | Padmanabhan ............... 705/7 |
| 2009/0135749 | A1* | 5/2009 | Yang ........................ 370/310 |
| 2009/0150521 | A1* | 6/2009 | Tripathi ..................... 709/220 |
| 2009/0150527 | A1* | 6/2009 | Tripathi et al. ............. 709/221 |
| 2009/0150529 | A1* | 6/2009 | Tripathi ..................... 709/222 |
| 2009/0150538 | A1* | 6/2009 | Tripathi et al. ............. 709/224 |
| 2009/0150547 | A1* | 6/2009 | Tripathi ..................... 709/226 |
| 2009/0150883 | A1* | 6/2009 | Tripathi et al. ................. 718/1 |
| 2009/0219935 | A1* | 9/2009 | Tripathi et al. ............. 370/392 |
| 2009/0219936 | A1* | 9/2009 | Tripathi et al. ............. 370/392 |
| 2009/0222567 | A1* | 9/2009 | Tripathi et al. ............. 709/230 |
| 2009/0238072 | A1* | 9/2009 | Tripathi et al. ............. 370/235 |
| 2009/0238189 | A1* | 9/2009 | Tripathi et al. .......... 370/395.32 |
| 2009/0278915 | A1 | 11/2009 | Kramer et al. |
| 2009/0326874 | A1* | 12/2009 | Nakamura et al. .............. 703/1 |
| 2010/0007675 | A1 | 1/2010 | Kang et al. |
| 2010/0064348 | A1* | 3/2010 | Matsumoto et al. ............. 726/4 |
| 2010/0088432 | A1* | 4/2010 | Itoh .............................. 710/16 |
| 2010/0090971 | A1 | 4/2010 | Choi et al. |
| 2010/0188473 | A1 | 7/2010 | King et al. |
| 2010/0251158 | A1 | 9/2010 | Geppert et al. |
| 2010/0272110 | A1* | 10/2010 | Allan et al. ............. 370/395.53 |
| 2010/0325571 | A1 | 12/2010 | Kodosky et al. |
| 2011/0019553 | A1* | 1/2011 | Tripathi et al. ............. 370/236 |
| 2011/0085016 | A1 | 4/2011 | Kristiansen et al. |
| 2012/0198523 | A1* | 8/2012 | Matsumoto et al. ............. 726/4 |
| 2012/0221704 | A1* | 8/2012 | Matsumoto et al. .......... 709/223 |
| 2012/0307640 | A1* | 12/2012 | Wackerly et al. ............. 370/241 |
| 2013/0117815 | A1* | 5/2013 | Goranov ........................ 726/3 |

OTHER PUBLICATIONS

Bing search q=hardware+software+chassis+route&qs Feb. 28, 2014.*
Bing search q=ladder+diagram&qs=n&form=QBLH&pq=I Jan. 30, 2014.*
Eternus sf storage cruiser Feb. 28, 2014.*
Eternus sf storage cruiser features Feb. 28, 2014.*
Eternus sf storage cruiser overview Feb. 28, 2014.*
Fujitsu storage eternus sf storage cruiser Jan. 31, 2014.*
Jp 2002-063063 a machine translation Apr. 6, 2001.*
International Search Report and Written Opinion in Application No. PCT/US2011/027141, dated May 26, 2011, 14 pages.
"MyGesture Editor: Gesture Mapping," FingerWorks, retrieved from <http://www.fingerworks.com/MyGestureEditor_mapping.html> on Aug. 1, 2009; 5 pages.
"LiveQuartz 1.8 (Free Image Editor) Adds Multi-Touch Support;" Softpedia, Apr. 21, 2008, retrieved from <http://news.softpedia.com/news/LiveQuartz-1-8-Free-Image-Editor-Adds-Multi-Touch-Support-83906.shtml> on Jan. 28, 2013; 2 pages.
Han, Jefferson Y.; "Low-cost multi-touch sensing through frustrated total internal reflection;" Proceedings of the 18th Annual ACM Symposium on user interface software and technology; Oct. 23-27, 2005; pp. 115-118.
Dan Rodney's List of Mac OS X Multi-Touch Gestures, Mac Central archive date Nov. 13, 2009, retrieved from <http:// web.archive.org/web/20091113062920/http://www.danrodney.com/mac/multitouch.html> on Feb. 20, 2013, 3 pages.
National Instruments, TM, LabVIEW, TM; Real-Timer User Manual, Apr. 2001 Edition, National Instruments Corporation, 46 pages.
Marks, Tracy; "Windows 95 Manual;" Windweaver Training, Arlington, Massachusetts, 1997, retrieved from <http://windweaver.com/w95man.htm> on Jan. 28, 2013; 9 pages.
National Instruments Corporation, LabVIEW User Manual, Chapter 2: Introduction to Virtual Instruments, Jul. 2000, XP-002227650, pp. 2-1-2-5.

* cited by examiner

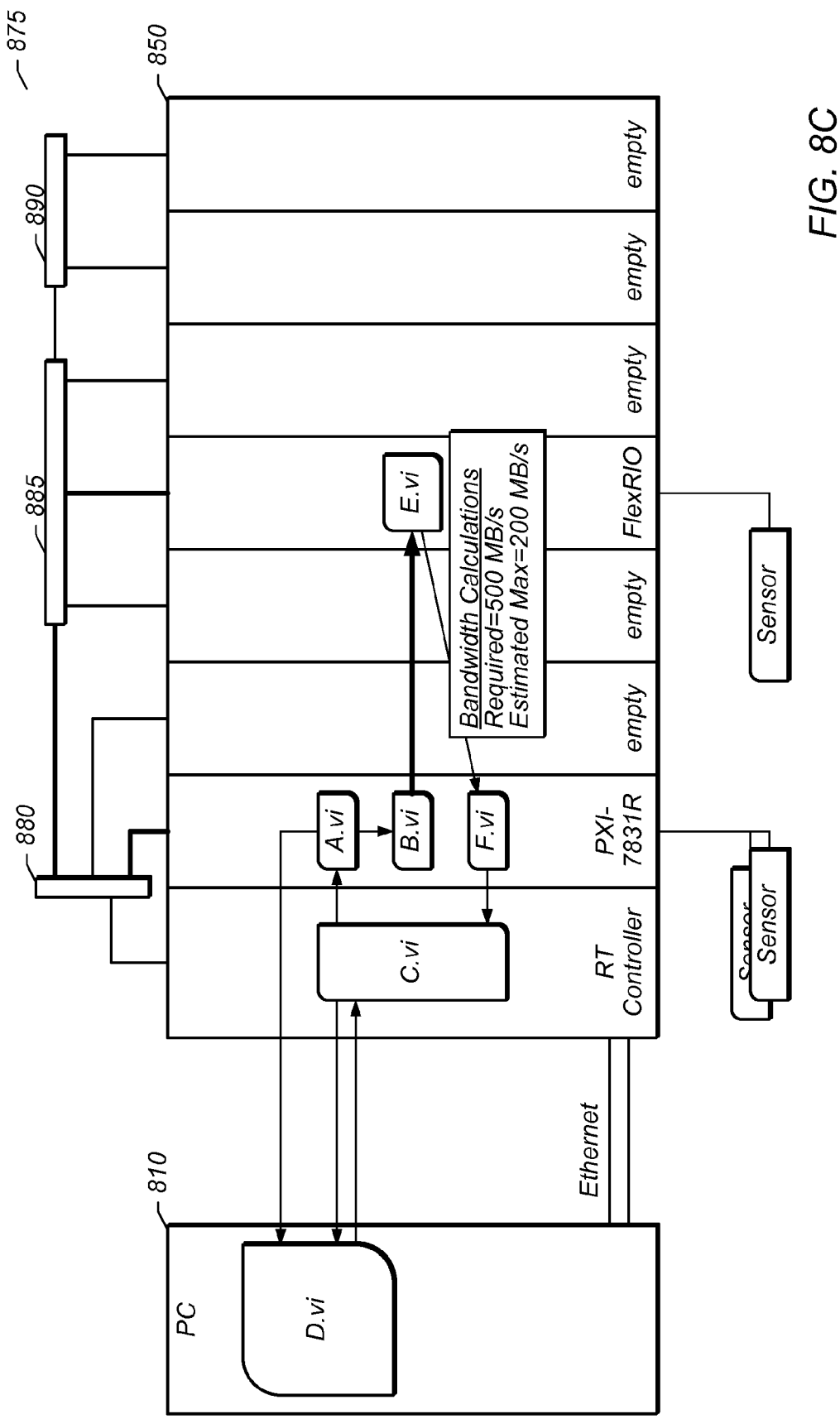

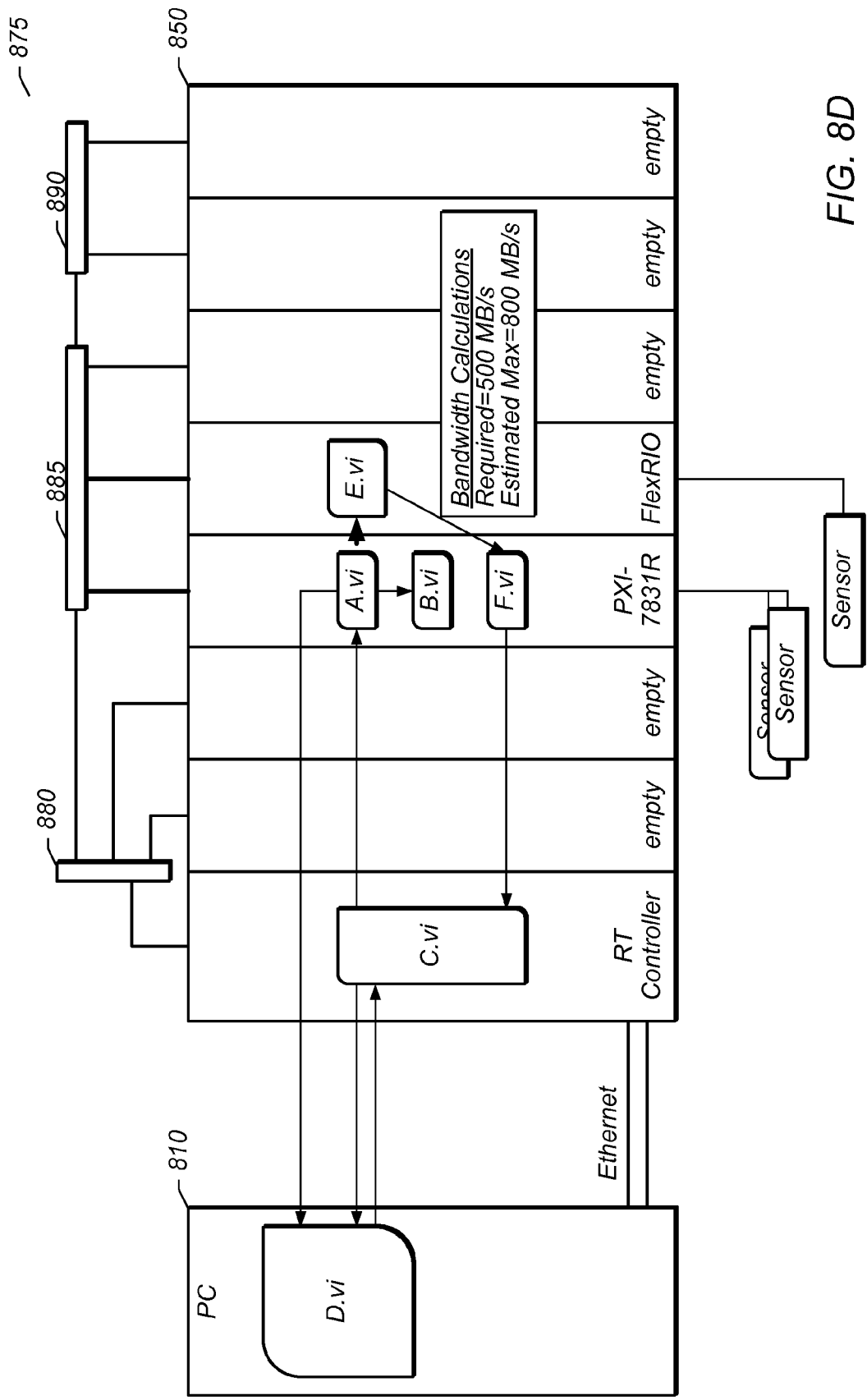

DISPLAYING PHYSICAL SIGNAL ROUTING IN A DIAGRAM OF A SYSTEM

FIELD OF THE INVENTION

The present invention relates to the field of system diagrams, and more particularly to a system and method for displaying physical signal routing in response to user input.

DESCRIPTION OF THE RELATED ART

Currently, many engineers design and use systems involving many different devices. Additionally, these different devices typically run or are configured according to disparate software programs that are deployed on or among multiple different devices. Accordingly, it is difficult for a designer or user of a system to fully understand all of hardware, physical interconnections, software, and software interconnections of such systems in an intuitive manner. Thus, improvements in understanding and designing systems are desired.

SUMMARY OF THE INVENTION

Various embodiments of a system and method for displaying physical signal routing in response to user input.

Initially, a diagram of a system may be displayed. The system may include a plurality of physical components connected via physical connections as well as a plurality of logical components (e.g., software) implemented on various ones of the physical components (e.g., devices or components within devices).

The diagram may include a plurality of icons connected by wires. The icons may represent various components of the diagram. For example, a first subset of the icons represent the plurality of logical elements of the system and wires between the first subset of icons may represent logical connections between them. The logical connection may indicate that there is data or signals passed between the respective logical components. For example, the logical connection may be a dataflow or buffered connection between the two logical elements.

Additionally, the diagram may include a second subset of icons that represent physical components of the system. In some embodiments, these icons may be connected together via wires. Accordingly, the wires may represent physical connections between the physical components, e.g., cables or physical signal routes between the physical components.

User input may be received to view signal routing information (or physical routing information) of the system. The user input may be received to view the signal routing information for the entire system, for a portion of the system (e.g., by selecting the portion of the system in the diagram), for a specific device or physical component in the system (e.g., by selecting the specific device or physical component), for one or more logical connections in the system, etc. For example, the user may provide input to a user interface to request to show signal routing information, e.g., at a diagram level. As another example, the user may select a specific logical connection (e.g., by selecting its corresponding wire) and/or select an option to view the signal routing information associated with the logical connection. In one embodiment, the user may simply select the wire without providing further user input. In some embodiments, the user input may be received via gestures, such as touch gestures received to a touch interface, such as a touch display. However, other types of user input are also envisioned, e.g., using a mouse, keyboard, etc.

Accordingly, signal routing information may be displayed in response to the user input. The specific signal routing information may vary depending on the particular user input received. For example, where the user selects or requests signal routing information for a specific logical connection, the signal route over of the data provided in the logical connection over a physical connection may be displayed or highlighted. For example, the signal routes of the system may already be shown (e.g., in the diagram or outside of the diagram, as desired) and visually indicating the signal route may include highlighting the signal route corresponding to the logical connection. In another embodiment, signal routes may not have been shown before the user input and the signal route corresponding to the logical connection may be displayed in response to the user input. Displaying a signal route may include displaying a graphical representation of the signal route in the diagram. Note that a signal route corresponding to a logical connection or wire may include a plurality of physical components and physical connections. For example, the signal route that is used to convey data between two logical components may require transmission over multiple devices, switches, muxes, cables, trace routes, etc. The signal route may be within a single device, between two devices, over a plurality of devices, etc.

In addition to displaying the signal route, further information may be displayed. For example, bandwidth information, such as the required bandwidth for the logical connection and the estimate bandwidth of the current physical connection/signal route may be displayed. Other characteristics of the signal route may be displayed, such as communication protocol, the nature of the physical connection (e.g., cable type, distance, etc.), and/or other characteristics may be provided.

Where the received user input relates to a portion of the system, or to the entire diagram, displaying the signal routing may involve displaying all available signal routes, signal routes that have corresponding logical connections in the diagram, etc. The signal routes may be displayed within the diagram or separately (e.g., in another diagram), as desired. Similar to above, characteristics of individual signal routes, groups of signal routes, etc. may be displayed in the diagram, e.g., in aggregate or per signal route.

BRIEF DESCRIPTION OF THE DRAWINGS

A better understanding of the present invention can be obtained when the following detailed description of the preferred embodiment is considered in conjunction with the following drawings, in which:

FIGS. 8A-8D are exemplary Figures corresponding to the method of FIG. 7.

Figure 1:
FIG. 1 illustrates a network system comprising two or more computer systems configured according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment".

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Pat. No. 7,042,469, titled "Multiple Views for a Measurement System Diagram," filed Dec. 23, 2002.

U.S. Patent Application Publication No. 2001/0020291 (Ser. No. 09/745,023) titled "System and Method for Programmatically Generating a Graphical Program in Response to Program Information," filed Dec. 20, 2000.

U.S. Patent Application Publication No. 2005/0050515 (Ser. No. 10/892,829) titled "A Graphical Program Which Executes a Timed Loop", filed Jul. 16, 2004.

U.S. patent application Ser. No. 11/462,393 titled "Asynchronous Wires in a Graphical Programming System," filed Aug. 4, 2006.

U.S. patent application Ser. No. 11/776,196, titled "Diagram That Visually Indicates Targeted Execution", filed Jul. 11, 2007, whose inventors were Jeffrey L. Kodosky, David W. Fuller III, Timothy J. Hayles, Jeffrey N. Correll, John R. Breyer, Jacob Kornerup, Darshan K. Shah, and Aljosa Vrancic.

U.S. patent application Ser. No. 12/869,270, titled "Graphically Specifying and Indicating Targeted Execution in a Graphical Program", filed Aug. 26, 2010, whose inventors were Jeffrey L. Kodosky, David W Fuller III, Timothy J. Hayles, Jeffrey N. Correll, John R. Breyer, Jacob Kornerup, Darshan K. Shah, and Aljosa Vrancic.

U.S. Pat. No. 7,650,316, titled "Automatic Generation of Help Information for Specified Systems", filed Mar. 10, 2006, whose inventors were Joseph E. Peck and Damien F. Gray.

Terms

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning. The term "program" includes 1) a software program which may be stored in a memory and is executable by a processor or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element.

Diagram—A graphical image displayed on a computer display which visually indicates relationships between graphical elements in the diagram. Diagrams may include configuration diagrams, system diagrams, physical diagrams, and/or graphical programs (among others). In some embodiments, diagrams may be executable to perform specified functionality, e.g., measurement or industrial operations, which is represented by the diagram. Executable diagrams may include graphical programs (described below) where icons connected by wires illustrate functionality of the graphical program. Alternatively, or additionally, the diagram may comprise a system diagram which may indicate functionality and/or connectivity implemented by one or more devices. Various graphical user interfaces (GUIs), e.g., front panels, may be associated with the diagram.

Graphical Program—A program comprising a plurality of interconnected nodes or icons, wherein the plurality of interconnected nodes or icons visually indicate functionality of the program. A graphical program is a type of diagram.

The following provides examples of various aspects of graphical programs. The following examples and discussion are not intended to limit the above definition of graphical program, but rather provide examples of what the term "graphical program" encompasses:

The nodes in a graphical program may be connected in one or more of a data flow, control flow, and/or execution flow format. The nodes may also be connected in a "signal flow" format, which is a subset of data flow.

Exemplary graphical program development environments which may be used to create graphical programs include LabVIEW, DasyLab, DiaDem and Matrixx/SystemBuild from National Instruments, Simulink from the MathWorks, VEE from Agilent, WiT from Coreco, Vision Program Manager from PPT Vision, SoftWIRE from Measurement Computing, Sanscript from Northwoods Software, Khoros from Khoral Research, SnapMaster from HEM Data, VisSim from Visual Solutions, ObjectBench by SES (Scientific and Engineering Software), and VisiDAQ from Advantech, among others.

The term "graphical program" includes models or block diagrams created in graphical modeling environments, wherein the model or block diagram comprises interconnected nodes or icons that visually indicate operation of the model or block diagram; exemplary graphical modeling environments include Simulink, SystemBuild, VisSim, Hypersignal Block Diagram, etc.

A graphical program may be represented in the memory of the computer system as data structures and/or program instructions. The graphical program, e.g., these data structures and/or program instructions, may be compiled or interpreted to produce machine language that accomplishes the desired method or process as shown in the graphical program.

Input data to a graphical program may be received from any of various sources, such as from a device, unit under test, a process being measured or controlled, another computer program, a database, or from a file. Also, a user may input data to a graphical program or virtual instrument using a graphical user interface, e.g., a front panel.

A graphical program may optionally have a GUI associated with the graphical program. In this case, the plurality of interconnected nodes are often referred to as the block diagram portion of the graphical program.

Data Flow Graphical Program (or Data Flow Diagram)—A graphical program or diagram comprising a plurality of interconnected nodes, wherein the connections between the nodes indicate that data produced by one node is used by another node.

Physical Diagram—A diagram which visually indicates physical connectivity between physical devices. For example, a physical diagram may visually indicate the connectivity of various physical components in a measurement system, e.g., a computer connected to a measurement device via an Ethernet network. Thus the wires in a physical diagram represent physical connectivity between devices. A physical diagram may show the corresponding "real world" physical system/devices.

Configuration Diagram—A diagram which indicates connectivity between real and/or virtual devices. A configuration diagram may visually indicate physical connectivity between physical devices as shown in a physical diagram. However, in some embodiments, one or more of the devices (or all of the devices) in the configuration diagram may be virtual or simulated devices. Thus, some or all of the devices in the configuration diagram may not be physically present in the system represented by the configuration diagram.

System Diagram—A diagram with one or more device icons and graphical program code, wherein the device icons are use to specify and/or visually indicate where different portions of graphical program code are deployed/executed. A system diagram may indicate where (i.e., on which system/device) programs or code may be executed. For example, the system diagram may include graphical indications showing where portions of the displayed graphical program code are executed. In some embodiments, various ones of the icons may represent processing elements which have associated programs for execution. At least one of the icons may represent logical elements (e.g., executable software functions or graphical program code). One or more of the device icons may represent configurable elements. Thus, the system diagram may provide a system view which allows a user to easily understand where graphical program code is deployed among the various devices in the system.

Node—In the context of a graphical program, an element that may be included in a graphical program. The graphical program nodes (or simply nodes) in a graphical program may also be referred to as blocks. A node may have an associated icon that represents the node in the graphical program, as well as underlying code and/or data that implements functionality of the node. Exemplary nodes (or blocks) include function nodes, sub-program nodes (sub-VIs), terminal nodes, structure nodes, etc. Nodes may be connected together in a graphical program by connection icons or wires. The term "logical element" may refer to a "node". For example, the term "logical element: may refer to a software program portion or code that is executable by (or implementable on) a processing element, and which is represented iconically on a display. Logical elements include virtual instruments (VIs), primitives, etc. Logical elements may be displayed in various ones of the diagrams described herein, e.g., in graphical programs, system diagrams, etc. A logical element may correspond to a software program that is executed by a processor or may correspond to a software program (or corresponding hardware configuration program) that is implemented on a programmable hardware element.

Wire—a graphical element displayed in a diagram on a display that connects icons or nodes in the diagram. The diagram may be a graphical program (where the icons correspond to software functions), a system diagram (where the icons may correspond to hardware devices or software functions), etc. The wire is generally used to indicate, specify, or implement communication between the icons. Wires may represent logical data transfer between icons, or may represent a physical communication medium, such as Ethernet, USB, etc. Wires may implement and operate under various protocols, including data flow semantics, non-data flow semantics, etc. Some wires, e.g., buffered data transfer wires, may be configurable to implement or follow specified protocols or semantics. Wires may indicate communication of data, timing information, status information, control information, and/or other information between icons. In some embodiments, wires may have different visual appearances which may indicate different characteristics of the wire (e.g., type of data exchange semantics, data transport protocols, data transport mediums, and/or type of information passed between the icons, among others).

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

The following provides examples of various aspects of GUIs. The following examples and discussion are not intended to limit the ordinary meaning of GUI, but rather provide examples of what the term "graphical user interface" encompasses:

A GUI may comprise a single window having one or more GUI Elements, or may comprise a plurality of individual GUI Elements (or individual windows each having one or more GUI Elements), wherein the individual GUI Elements or windows may optionally be tiled together.

A GUI may be associated with a diagram, e.g., a graphical program. In this instance, various mechanisms may be used to connect GUI Elements in the GUI with nodes or icons in the diagram/graphical program. For example, when Input Controls and Output Indicators are created in the GUI, corresponding nodes (e.g., terminals) may be automatically created in the diagram or graphical program. Alternatively, the user can place terminal nodes in the diagram which may cause the display of corresponding GUI Elements front panel objects in the GUI, either at edit time or later at run time. As another example, the GUI may comprise GUI Elements embedded in the block diagram portion of the graphical program.

Front Panel—A Graphical User Interface that includes input controls and output indicators, and which enables a user to interactively control or manipulate the input being provided to a program or diagram, and view output of the program or diagram, during execution.

A front panel is a type of GUI. A front panel may be associated with a diagram or graphical program as described above.

In an instrumentation application, the front panel can be analogized to the front panel of an instrument. In an industrial automation application the front panel can be analogized to the MMI (Man Machine Interface) of a device. The user may adjust the controls on the front panel to affect the input and view the output on the respective indicators.

Graphical User Interface Element—an element of a graphical user interface, such as for providing input or displaying output. Exemplary graphical user interface elements comprise input controls and output indicators Input Control—a graphical user interface element for providing user input to a program. Exemplary input controls comprise dials, knobs, sliders, input text boxes, etc.

Output Indicator—a graphical user interface element for displaying output from a program. Exemplary output indicators include charts, graphs, gauges, output text boxes, numeric displays, etc. An output indicator is sometimes referred to as an "output control".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are operable to acquire and/or store data. A measurement device may also optionally be further operable to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further operable to perform control functions, e.g., in response to analysis of the acquired or stored data. For example, the measurement device may send a control signal to an external system, such as a motion control system or to a sensor, in response to particular data. A measurement device may also be operable to perform automation functions, i.e., may receive and analyze data, and issue automation control signals in response.

Processing Element—A hardware component or device which is operable to execute software, implement code (e.g., program code), be configured according to a hardware description, etc. Processing elements include various processors and/or programmable hardware elements (e.g., field programmable gate arrays (FPGAs)), or systems that contain processors or programmable hardware elements, among others. For example, a processing element may refer to an individual processor in a computer system or the computer system itself.

Configurable Elements—Systems or devices that provide configurable functionality but do not themselves includes processors that process data. Configurable elements may produce and/or consume data that may be provided to or received from various processing elements. A configurable element may have or receive configuration data that specifies functionality of the configurable element. Configurable elements comprise data acquisition (DAQ) devices and/or other sensors/devices.

Gesture—A touch gesture or other gesture (e.g., using a mouse or other input device). For example, the user may provide a touch gesture using one or more fingers or may provide a mouse gesture using a mouse (e.g., by providing clicks or movements of the mouse while a click is depressed, among other types of mouse gestures).

As used herein, a "touch gesture" refers to a touch interaction with a touch interface. A touch gesture may include the use of one finger (or digit), two fingers (e.g., to perform two simultaneous touches), three fingers, four fingers, five fingers, etc. A touch gesture involving one touch (e.g., by a single finger or digit) may be referred to as a "single-touch gesture" and a gesture involving more than one touch (e.g., by a plurality of fingers or digits) may be referred to as a "multi-touch gesture". Generally, a touch gesture is begun by initiating a touch and is ended when the touch is no longer present (e.g., when there is no longer any touch on the touch interface or when the initial touch is no longer on the touch interface).

Exemplary touch gestures include a single touch (e.g., a "tap" with a single finger), a double touch (e.g., a "double tap" with a single finger), a two finger touch (e.g., a "tap" using two fingers simultaneously), a three finger touch, a four finger touch, a five finger touch, an expansion gesture (e.g., a "reverse pinch" or "spread" where two touches are initiated and then the distance between the two touches are increased while both remain in contact with the touch interface, although more than two touches may be used, e.g., with three touches where at least one touch moves away from the other two touches), a minimization gesture (e.g., a "pinch" where two touches are initiated and then the distance between two touches are decreased while both remain in contact with the touch interface, although more than two touches are envisioned), a "drag" or "slide" gesture using one or more touches (e.g., where a single touch is initiated, then moved some distance along the touch interface, and then released), a "flick" gesture using one or more touches (e.g., where a touch is initiated and then quickly moved along the touch interface and released), a "press" gesture (e.g., where one or more touches are initiated and then held for a threshold amount of time, longer than a tap gesture), a "press and tap" gesture (e.g., where one or more touches are "pressed" and then a second one or more touches are "tapped").

In some embodiments, gestures may include drawing or outlining. For example, a user may provide a gesture by touching the touch interface and then drawing a shape (e.g., an "L", backwards "L", a circle, a square, or any type of shape or sequence of lines). The user may create the shape using any number of simultaneous touches (e.g., using one finger, using two fingers, etc.) and each may be distinguishable from the next based on the number of touches and drawn shape. Thus, gestures may include outlines or drawings of shapes. Similar gestures can be achieved using a mouse. Generally, gestures described herein are more complex than simple single tap gestures. These gestures may be referred to as "complex gestures". Accordingly, as used herein, a "complex gesture" is any gesture other than (or more complex than) a single tap (e.g., a single touch tap). Generally, a complex touch gesture includes a single touch and additional touch input (e.g., such as another touch for a two touch tap, additional movement for a drag, increased time for a "touch and hold" gesture, etc.). Additionally, any instance of a "gesture" used herein may refer to a "complex gesture" or "complex touch gesture".

FIG. 1—Networked Computer System

FIG. 1 illustrates a system including a first computer system 82 that is coupled to a second computer system 90, where one or both of the computers are operable to execute a system diagram, e.g., a graphical program, according to embodiments of the present invention. The computer system 82 may be coupled via a network 84 (or a computer bus) to the second computer system 90. The computer systems 82 and 90 may each be any of various types, as desired, the particular types shown in FIG. 1 being exemplary only. For example, in some embodiments, the second computer 90 may be a "computer on a card" in a chassis or even installed in the first computer 82. In another embodiment, the second computer may be a programmable hardware element, such as a field programmable gate array (FPGA), or other programmable logic.

As shown in FIG. 1, the computer system 82 (and/or 90) may include a display device operable to display the system diagram, e.g., the graphical program, as the system diagram is created and/or executed. The display device may also be operable to display a graphical user interface or front panel of the system diagram during execution of the system diagram. The graphical user interface may comprise any type of graphical user interface, e.g., depending on the computing platform.

The computer system 82 may include at least one memory medium on which one or more computer programs or software components according to one embodiment of the present invention may be stored. For example, the memory medium may store one or more graphical programs (or other types of programs) that are executable to perform the methods described herein. Additionally, the memory medium may store a development environment application, e.g., a graphical programming development environment application used to create and/or execute such graphical programs. The memory medium may also store operating system software, as well as other software for operation of the computer system. Various embodiments further include receiving or storing instructions and/or data implemented in accordance with the foregoing description upon a carrier medium.

The network 84 can also be any of various types, including a LAN (local area network), WAN (wide area network), the Internet, or an Intranet, among others. The computer systems 82 and 90 may execute a system diagram, e.g., a graphical program, in a distributed fashion. For example, in one embodiment, computer 82 may execute a first portion of the block diagram of a graphical program and computer system 90 may execute a second portion of the block diagram of the graphical program, as will be described in more detail below. As another example, computer 82 may display the graphical user interface of a graphical program and computer system 90 may execute the block diagram of the graphical program.

In one embodiment, the graphical user interface of the graphical program may be displayed on a display device of the computer system 82, and the block diagram may execute on a device coupled to the computer system 82. The device may include a programmable hardware element and/or may include a processor and memory medium which may execute a real time operating system. In one embodiment, the graphical program may be downloaded and executed on the device. For example, an application development environment with which the graphical program is associated may provide support for downloading a graphical program for execution on the device in a real time system. Of course, the graphical program may be distributed in other ways as desired. For example, various portions of the block diagram of the graphical program may be targeted for execution across multiple targets or platforms.

Figure 2:
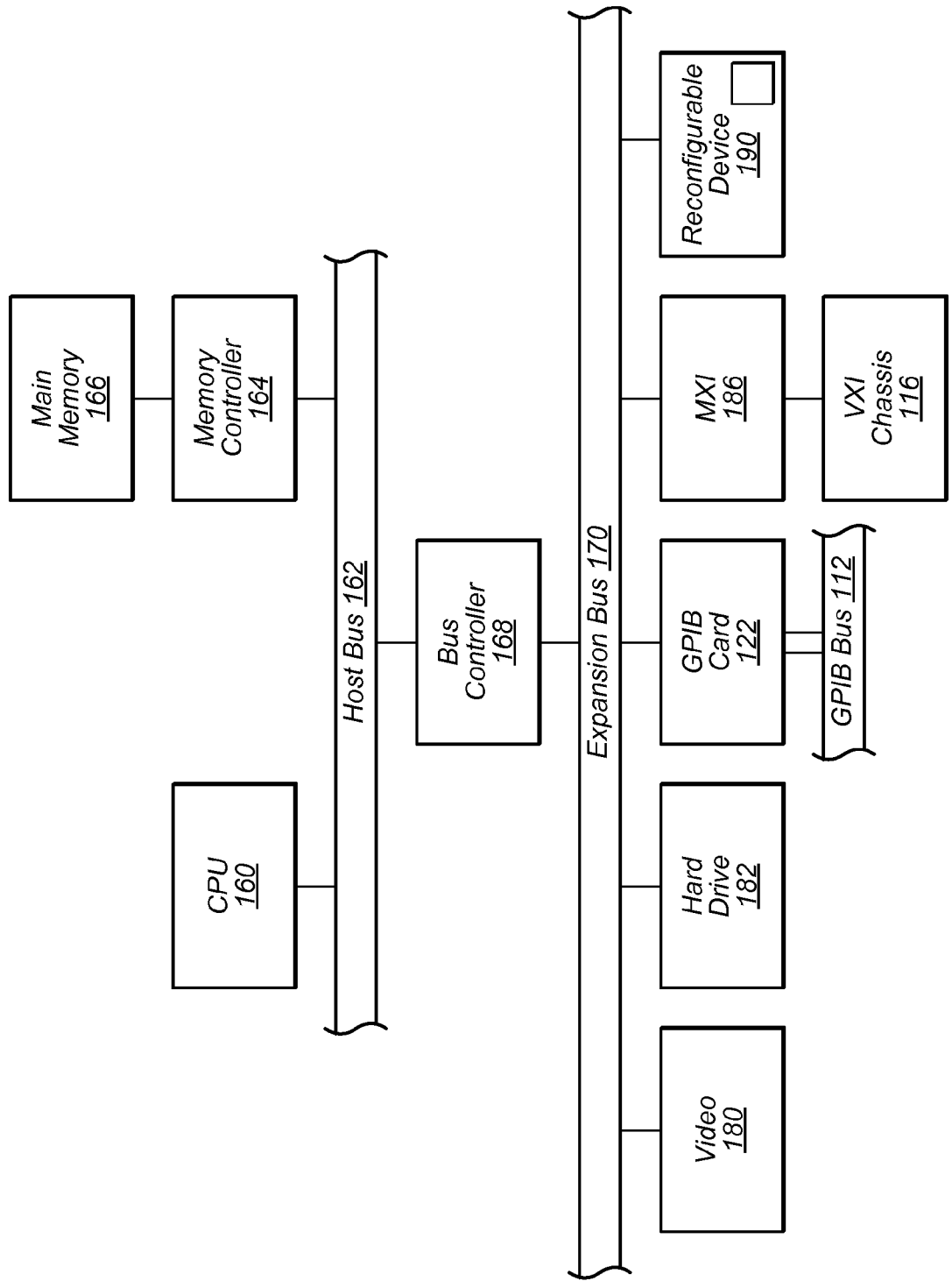
FIG. 2 is a block diagram of an exemplary computer system, according to one embodiment.

FIG. 2—Computer System Block Diagram

FIG. 2 is a block diagram representing one embodiment of the computer system 82 and/or 90 illustrated in FIG. 1, or computer system 82 shown in FIG. 2A or 2B. It is noted that any type of computer system configuration or architecture can be used as desired, and FIG. 2 illustrates a representative PC embodiment. It is also noted that the computer system may be a general-purpose computer system, a computer implemented on a card installed in a chassis, or other types of embodiments. Elements of a computer not necessary to understand the present description have been omitted for simplicity.

The computer may include at least one central processing unit or CPU (processor) 160 which is coupled to a processor or host bus 162. The CPU 160 may be any of various types, including an x86 processor, e.g., a Pentium class, a PowerPC processor, a CPU from the SPARC family of RISC processors, as well as others. A memory medium, typically comprising RAM and referred to as main memory, 166 is coupled to the host bus 162 by means of memory controller 164. The main memory 166 may store the graphical program operable to be distributed across multiple execution targets, as well as a development environment for creating the graphical program, and for specifying its distribution over multiple execution targets. The main memory may also store operating system software, as well as other software for operation of the computer system.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used. The expansion bus 170 includes slots for various devices such as described above. The computer 82 further comprises a video display subsystem 180 and hard drive 182 coupled to the expansion bus 170.

As shown, a device 190 may also be connected to the computer. The device 190 may include a processor and memory which may execute a real time operating system. The device 190 may also or instead comprise a programmable hardware element. The computer system may be operable to deploy a graphical program, or a portion of a graphical program, to the device 190 for execution of the graphical program on the device 190. The deployed graphical program may take the form of graphical program instructions or data structures that directly represents the graphical program. Alternatively, the deployed graphical program may take the form of text code (e.g., C code) generated from the graphical program. As another example, the deployed graphical program may take the form of compiled code generated from either the graphical program or from text code that in turn was generated from the graphical program. Below are described various embodiments of a method for specifying and implementing directed or distributed execution of a graphical program.

Figure 3A:
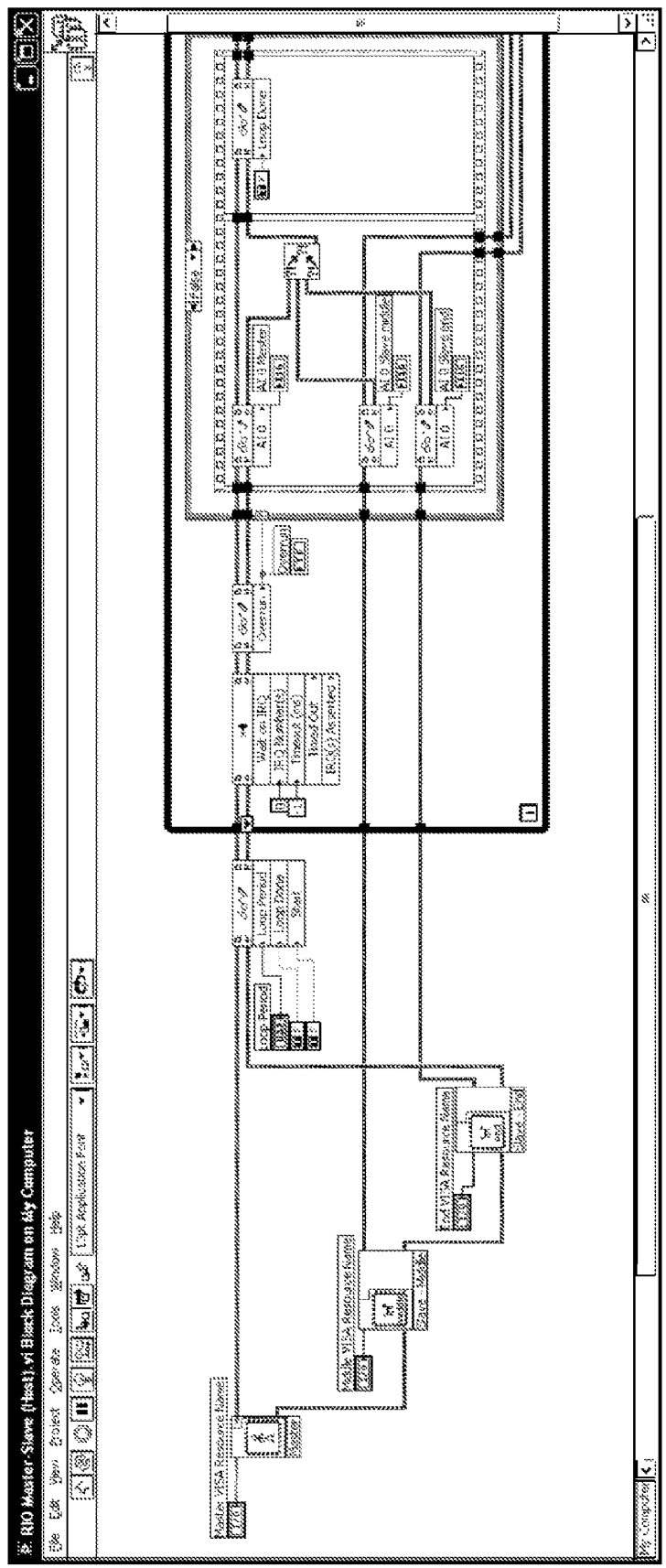
FIGS. 3A and 3B are screen shots of an exemplary graphical program according to one embodiment.
Figure 3B:
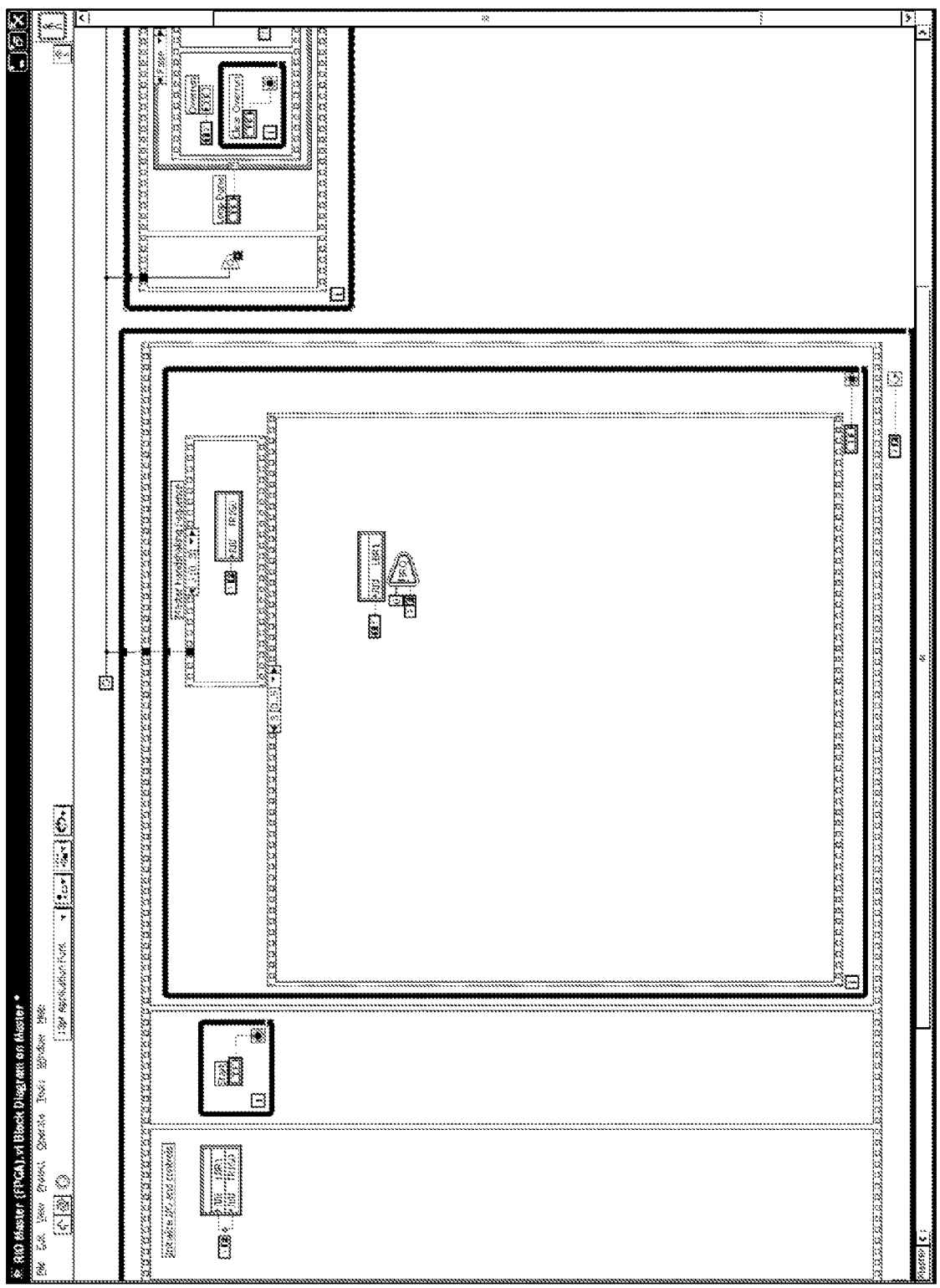

FIGS. 3A and 3B—Exemplary Graphical Programs

As described above, a graphical program may include a block diagram portion and a graphical user interface portion. In some embodiments, the graphical user interface portion may be comprised within the block diagram portion. The block diagram portion may include a plurality of interconnected nodes or icons which visually indicate functionality of the graphical program. Each of the nodes may have one or more inputs and/or outputs for accepting and/or providing data to other nodes in the graphical program. Each of the nodes in the graphical program may represent software functions or executable code. In other words, the nodes in the graphical program may represent or comprise logical elements (e.g., virtual instruments (VIs), primitives, etc.).

The nodes in the graphical program may be interconnected by lines or wires which indicate that indicate that data are provided from a first node to a second node in the graphical program. In some embodiments, the wires may be connected to the terminals of nodes in the graphical program. The terminals may provide connection points for connecting the wires to a node, e.g., to individual inputs or outputs of the node. Additionally, as described herein, these wires may be configured (e.g., automatically or manually) to provide data synchronously or asynchronously using various data exchange semantics and/or data transfer mechanisms (among others). In some embodiments, wires which indicate transfer of data may be referred to as data transfer wires.

In some embodiments, the graphical program may include one or more structure nodes which indicate control flow among one or more nodes in the graphical program. For example, the graphical program may include a conditional structure node (e.g., to implement conditional branching, if statements, switch statements, signal routing, etc.), a looping structure node for implementing looping among one or more nodes (e.g., while loops, do while loops, for loops, etc.), and/or other control flow nodes.

Additionally, the graphical program may visually indicate where portions of the graphical program are executed. In one embodiment, the visual indication may include a rectangular box that contains a portion of graphical code. In some embodiments, this visual indication may be referred to as a target execution node or icon. The target execution node may have an interior portion where graphical program code that is targeted for execution on a device is contained. For example, a device icon that includes an interior portion that is designed to receive graphical program code may be referred to as a target execution node. Additionally, or alternatively, this node may be referred to as a execution target structure node, as described in U.S. Provisional Ser. No. 60/869,221 and incorporated by reference above. As described in this provisional application, the target execution node may include (e.g., may reference) contextual information that allows the graphical program code to be executed on a target device.

The graphical program may be created or assembled by the user arranging on a display (e.g., of the computer system 82) a plurality of nodes or icons and then interconnecting the nodes to create the graphical program. In some embodiments, the user may select icons and/or wires from various palettes shown in a development environment on the display. In response to the user assembling the graphical program, data structures may be created and stored which represent the graphical program. As noted above, the graphical program may comprise a block diagram and may also include a user interface portion or front panel portion. Where the graphical program includes a user interface portion, the user may optionally assemble the user interface on the display. As one example, the user may use the LabVIEW development environment to create the graphical program.

In an alternate embodiment, the graphical program may be created by the user creating or specifying a prototype, followed by automatic creation of the graphical program from the prototype. This functionality is described in U.S. patent application Ser. No. 09/587,682 titled "System and Method for Automatically Generating a Graphical Program to Perform an Image Processing Algorithm", which was incorporated by reference in its entirety above. Further descriptions regarding automatic creation of graphical programs can be found in U.S. Patent Application Publication No. 2001/0020291 which was also incorporated by reference above. Thus, the graphical program may be created in other manners, either manually (by the user) or automatically, as desired. The graphical program may implement a measurement function that is desired to be performed by one or more devices or instruments (e.g., indicated by target execution icons). In other embodiments, the graphical program may implement other types of functions, e.g., control, automation, simulation, and so forth, as desired.

FIGS. 3A and 3B illustrate exemplary portions of a graphical program according to one embodiment. As shown, the graphical program includes a plurality of interconnected nodes which visually indicates functionality of the graphical program.

Thus, the plurality of interconnected nodes may visually indicate functionality of the graphical program. In other words, during execution of the graphical program, the functionality represented by the plurality of interconnected nodes may be performed.

FIGS. 4A-4G—Exemplary System Diagrams

A system diagram may refer to a diagram comprising one or more device icons and graphical program code, wherein the device icons are use to specify and/or visually indicate where different portions of graphical program code are deployed/executed. A system diagram may include icons or nodes that are connected by lines or wires, e.g., device icons connected to other device icons, a first graphical code portion connected to a second graphical code portion.

In a system diagram, a first node or icon may provide data on an output and a wire may connect the output of the node to an input of a second node. Similar to descriptions above, an icon or node providing data on an output may refer to a device executing code represented by the icon or node resulting in transferal of data to between or among the software representing the nodes. Note that the program code or functions represented by the icons may be executing on one device or among a plurality of devices. For example, a first device may be executing code of the first node and a second device may be executing code of the second node, and data may be transferred between the devices as indicated by the nodes and/or wires connecting the nodes.

Thus, the icons (nodes) in the system diagram may represent logical elements such as, for example, software functions or virtual instruments. Similar to the graphical programs described above, graphical indications may be displayed on the diagram which visually indicate where code represented by the various icons execute. For example, target execution icons may visually outline one or more of the icons and indicate that software represented by those icons execute on a specified target or device. Thus, a target execution icon may include one or more icons or nodes (e.g., in the interior portion of the target execution icon) and may indicate where the one or more icons or nodes are executed. For example, where the target execution icon represents a computer system, the icons or nodes inside the target execution icon may be executed by the computer system. Note that target execution icons may be automatically populated in the system diagram based on discovery of available devices, as desired. Alternatively, the user may include target execution icons by selecting types of devices (or classes of devices) or including template target execution icons and then configuring the target execution icons.

Note that the target execution icon may be "bound" or associated with a specific device. For example, the target execution icon may refer to a single device with a known address (e.g., IP address, bus address, etc.) and that icons or nodes within the target execution icon may be executed by that specific device during execution. The user may choose the specific device by selecting the device from a list of available devices (e.g., as automatically populated or detected by the development environment). For example, the user may configure the target execution icon (e.g., as described above) to select the appropriate device. Note that when a specific device is selected for the target execution icon, the target execution icon may be automatically displayed in the diagram with resources of the specific device visually represented. For example, if a specific microprocessor is selected, the available DMA channels of the processor may be automatically displayed in or on the target execution icon. For example, one or more terminals or wires may be displayed connected to or on the target execution icon which indicate the available DMA channels of the processor. Alternatively, or additionally, the resources of the execution device may be displayed in a palette, and the user may select and associate the resources with nodes in the target execution icon. The palette may indicate whether the resources are available (e.g., by being present or active) or not available (e.g., by not being present or being "grayed out" (or otherwise indicated)). Additionally, a programmable target (one that is able to be configured) may have a visual indication of that programmability (e.g., such as by having a white or open interior portion) whereas one that is not programmable may not have such an indication (e.g., may be grayed out or a different color).

Note that in some embodiments, one or more icons or nodes may be displayed outside of target execution icons. In such embodiments, the one or more icons or nodes may be executed by a default device, system, and/or processing element. For example, nodes outside of any target execution icons (or nodes/software functions not associated with target execution icons) may be executed by a controlling computer system or other processing element. The default processing element may be referred to as the implicit context or execution device of the diagram, whereas target execution icons explicitly define the context or execution device for nodes associated therewith.

In some embodiments, the devices represented in the system (e.g., processing elements, configurable elements, and/or other devices) may be physically present in the system or may be virtual (e.g., the devices may be simulated during execution of the system diagram) as desired. Additionally, these devices may operate according to the functionality visually represented by the icons in the system diagram which represent the devices. Note that the virtual devices of the system diagram may have an underlying model which is usable (e.g., executable) to simulate behavior of a real device corresponding to the virtual device. For example, the underlying model may be a graphical program or other executable code. Alternatively, or additionally, the virtual devices may represent devices that are desired and/or required for the system (e.g., according to user input).

Additionally, as described above regarding graphical programs, one or more GUIs may be associated with the system diagram (e.g., logical or physical components of the system diagram) which may be used during execution of the system diagram. In some embodiments, the GUI(s) may be associated with the graphical program portions that are executed by the various processing elements/devices. Thus, the GUI(s) may act as a front panel to the system diagram during execution (e.g., for receiving user input and displaying information regarding various variables, functions, devices, and/or sensors (among others) that execute or operate during execution of the system diagram).

Thus, the system diagram may allow for a logical view of a system as well as indications regarding execution targets of code represented in the system diagram. Further, in some embodiments, the system diagram may also indicate physical layouts of the system (e.g., physical connectivity as well as indications regarding execution of the logical elements of the diagram). In primary embodiments, the system diagram at least includes interconnected icons representing software (e.g., graphical program code) and one or more graphical indications (e.g., target execution icons) which indicate where these logical elements execute.

Similar to the descriptions above regarding assembly of a graphical program, system diagrams may be assembled manually (e.g., where the user selects icons and connects the icons using wires) or automatically (e.g., in response to user input specifying a desired functionality), as desired. Thus, a system diagram may be assembled manually or automatically and may include logical elements, processing elements, and/or configurable elements, as desired.

Figure 4A:
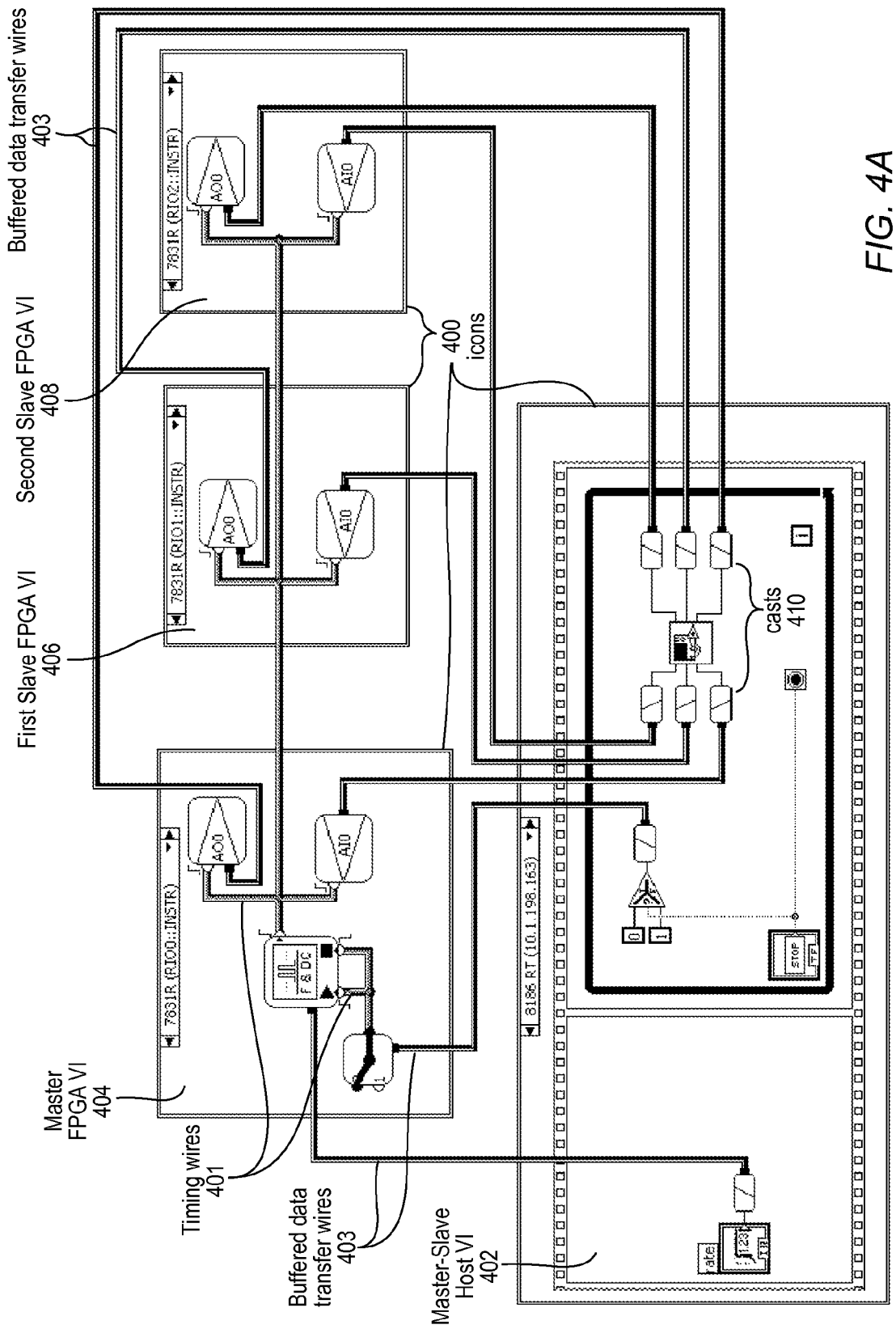
FIG. 4A is a screen shot of an exemplary system diagram which corresponds to FIGS. 3A and 3B.

As shown, FIGS. 4A-4F illustrate exemplary system diagrams according to one embodiment. More specifically, FIG. 4A illustrates an exemplary system diagram which is similar to the portions of the graphical program shown in FIGS. 3A and 3B. This system diagram is directed to a system that includes four different execution targets, specifically, a host computer and three FPGAs. Each of these targets is represented by a respective icon 400 (e.g., an execution target icon) that contains a respective graphical program or graphical program portion, in this embodiment, written in "G", the graphical programming language of the LabVIEW graphical development environment provided by National Instruments Corporation, and referred to as a virtual instruments (VI), although it should be noted that the "G" used may be an extended version in accordance with the techniques and features disclosed herein.

As FIG. 4A indicates, a Master-Slave Host VI 602 is shown targeted for execution on host computer (e.g., controller)

"8186 RT (10.1.198.163)", as the lower "box" or icon is labeled. This host computer preferably executes a real time execution engine, such as LabVIEW RT, as the "RT" indicates. The Master-Slave Host VI is coupled to respective VIs targeted for execution on respective DAQ boards, specifically, R-Series DAQ boards, as provided by National Instruments Corporation. These three VIs are shown contained in respective icons (e.g., execution target icons), where the icon labeled "7831R (RIO0::INSTR)" contains a Master FPGA VI 404, "7831R (RIO1::INSTR)" contains a first Slave FPGA VI 406, and "7831R (RIO2::INSTR)" contains a second Slave FPGA VI 408. Thus, the icons (e.g., execution target icons) may partition the diagram into regions or portions with targeted execution.

In an exemplary application, the host process (the Master-Slave Host VI executing on host computer "8186 RT (10.1.198.163)") controls performance of data acquisition operations (reads/writes) by the three DAQ boards executing their respective VIs, e.g., stimulating and capturing responses from three units under test (UUT). In one exemplary embodiment, the execution targets may be implemented on respective PXI cards in a PXI chassis, although other implementations may be used as desired.

Additionally, as shown, the Master-Slave Host VI specifies a clock rate via the leftmost node labeled "rate", and sends this rate via a buffered data transfer wire 603 to a clock node in the Master FPGA VI (in "7831R (RIO0::INSTR)"), labeled "F & DC", which operates to generate and send a logical or Boolean clock signal (a sequence of T/F values) to respective Analog Input and Analog Output nodes in 7831R (RIO0::INSTR)", "7831R (RIO1::INSTR)", and "7831R (RIO2::INSTR)", where the Analog Input nodes are each labeled "AI0", and the Analog Output nodes are each labeled "AO0". Note that on/off control of this clock signal generation is via a switch node (shown just below and to the left of the clock node, which is itself controlled by the Master-Slave Host VI, as may be seen. As FIG. 4A shows, timing wires 401 connect the clock node to the switch node and to the Analog Input and Output nodes.

As FIG. 4A further shows, each of the Analog Input and Analog Output nodes is triggered on a rising edge of the clock signal, as indicated by rising signal edges displayed near the terminals of the nodes. On each rising edge of the clock signal, each Analog Output node may operate to receive a value from the Master-Slave Host VI and generate a corresponding analog signal that may, for example, be provided to a respective UUT. As may be seen, the Analog Output nodes are each coupled via a buffered data transfer wire 403 to a node, e.g., a function or analysis node, referred to simply as a function node for brevity, positioned in a while loop in the Master-Slave Host VI, where these three wires exit the VI on the right. Note that the while loop determines the rate that new data values are supplied to the Analog Output nodes (by the function node). The times when the Analog Output nodes consume this data and generate voltages corresponding to these data are controlled by the timing wire. If the time comes to consume a value and none is there, the Analog Output node may not produce a new voltage but rather may retain its previous output state.

Also on this rising edge of the clock signal, each Analog Input node may receive an analog signal, e.g., from the UUT, digitize the signal, and send the value (or values) to the Master-Slave Host VI. Similar to the Analog Output nodes, each Analog Input node is coupled to the function node via a respective wire, where, as may be seen, the wires enter from the top of the VI and couple to the node from the left. Thus, the function node may both control signals to be provided to the UUTs and receive (and possibly process and/or analyze) signals returned from the UUTs.

Note the (six) intervening lozenge-shaped elements 410 coupling the wires to the function node. These elements, which may be referred to as "semantic casts" or simply "casts", may operate as interfaces between nodes that operate in accordance with data flow semantics and wires that do not operate in accordance with data flow semantics. For example, in the system diagram of FIG. 7F, the wires connecting the Analog I/O nodes to the function node are buffered data transfer wires, where data placed on the wire may be stored in a temporary data structure, e.g., a FIFO, before being read from the wire. Thus, the data on or in the wire is buffered. This is in direct contrast to data flow wires, where the data placed on a wire in one cycle must be consumed (read) that same cycle. These casts may be configured to implement specified rules governing reads and writes of data on the wires. For example, in the case that the buffered data transfer wires use FIFOs, in the case where a FIFO is empty, the function node may be prevented from attempting to read from the wire, and so the cast may impose the rule that when a FIFO is empty, the while loop containing the function node may be halted until data are available again, although it should be noted that is but one example of such a rule.

Figure 4B:
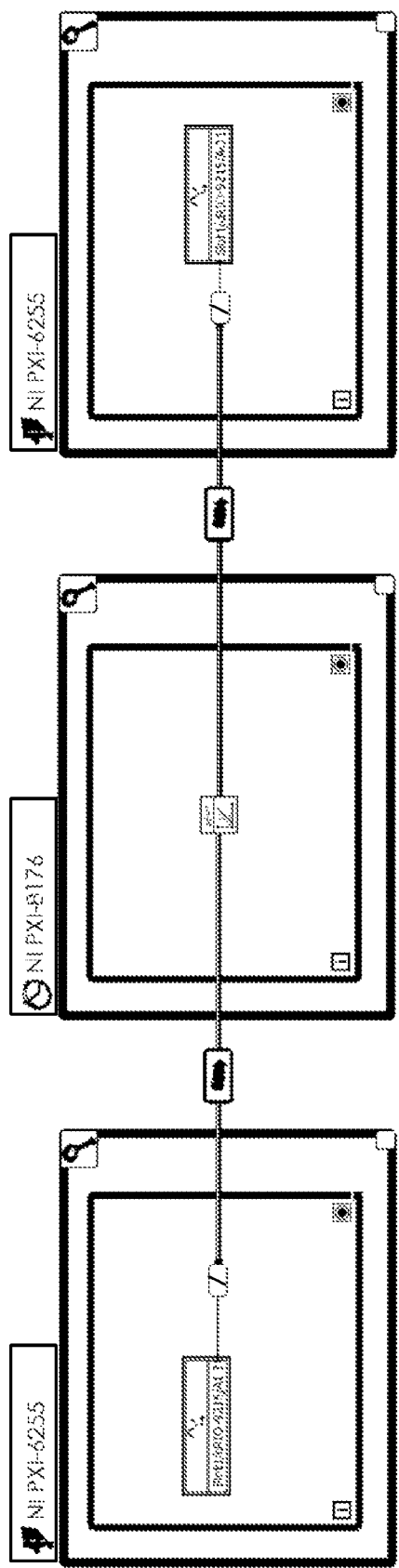
FIGS. 4B-4G are screen shots of exemplary system diagrams according to some embodiments.
Figure 4C:
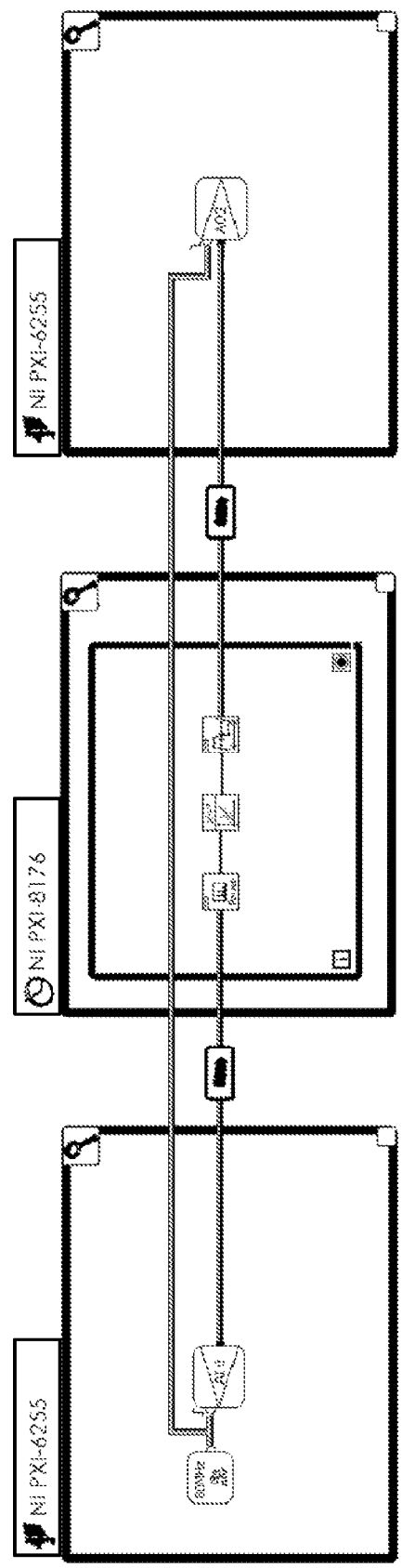
Figure 4D:
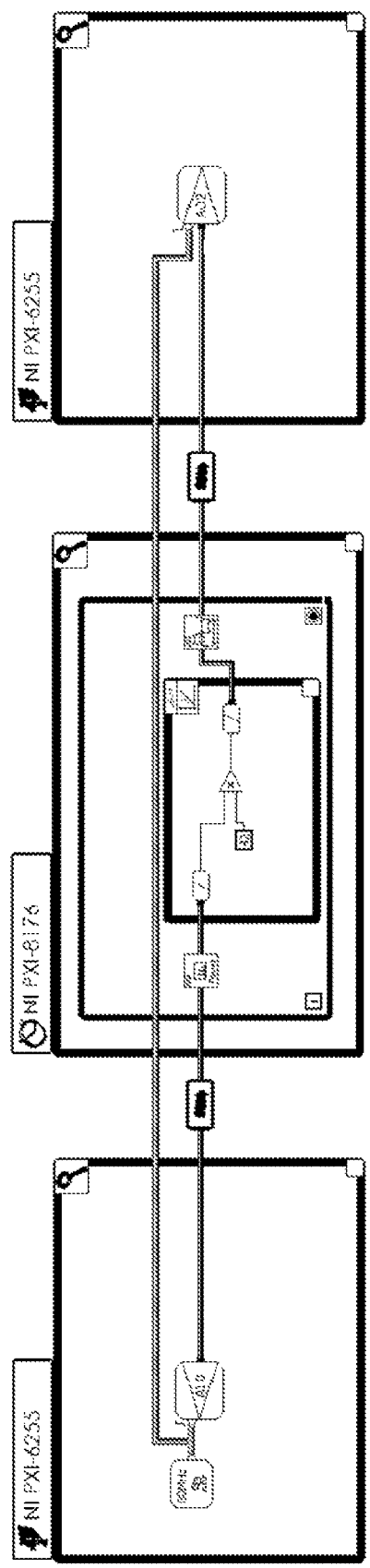
Figure 4E:
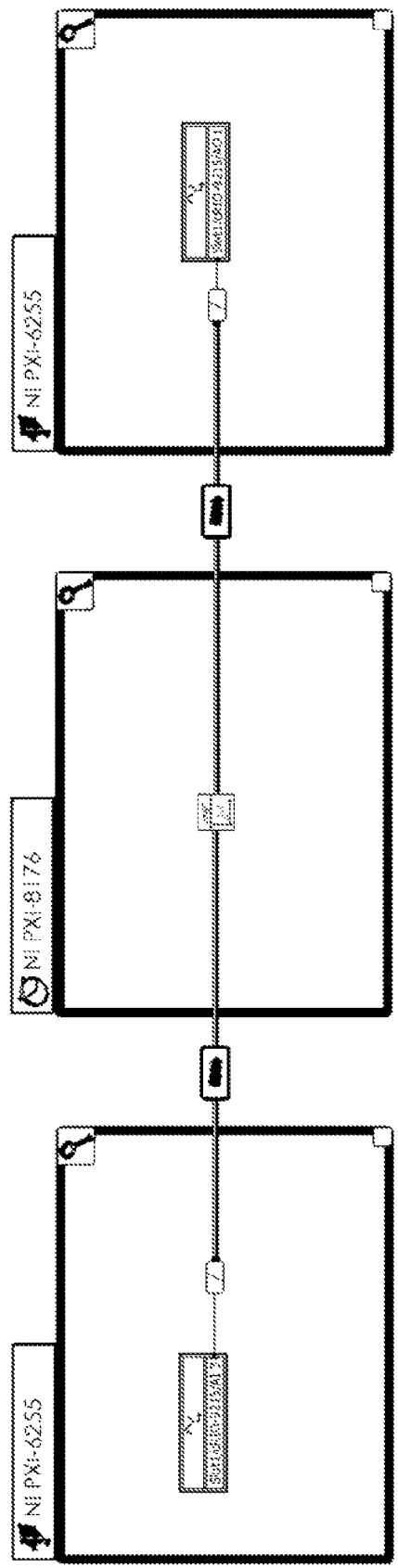

FIG. 4B illustrates an exemplary system diagram with two configurable device icons (representing the same device, NI PXI-6255) are connected to a target execution icon (representing the execution device, NI PXI-8176). As shown, each target execution icon/configurable device icon includes a single node (except for the icon in NI PXI-8176 which is displayed inside a while structure), and where the icons are interconnected by lines. The icon in each target execution icon may represent a plurality of icons which may be interconnected (e.g., the icon of the execution icon may be a VI or sub-VI). FIG. 4C illustrates an exemplary system diagram where the icons of the target execution icons are expanded, and where the ADC's in the NI PXI-6255 are connected by timing wires, and FIG. 4D illustrates an exemplary system diagram where a further sub-VI is expanded. FIG. 4E illustrates an exemplary system diagram where each target execution icon includes a single node, which, similar to FIG. 4B, may represent a plurality of icons that may be interconnected (e.g., the icon of the execution icon may be a VI or sub-VI).

More specifically, FIGS. 4B-4E illustrate system diagrams where a first device (NI PXI-6255) stores a first portion of a graphical program that represents configuration of the device for communication with a second device (NI PXI-8176). In these cases, the second device then provides data (during execution) back to the first device. Thus, FIGS. 4B-4E show both physical and logical relationships among graphical program portions executing on two devices.

Figure 4F:
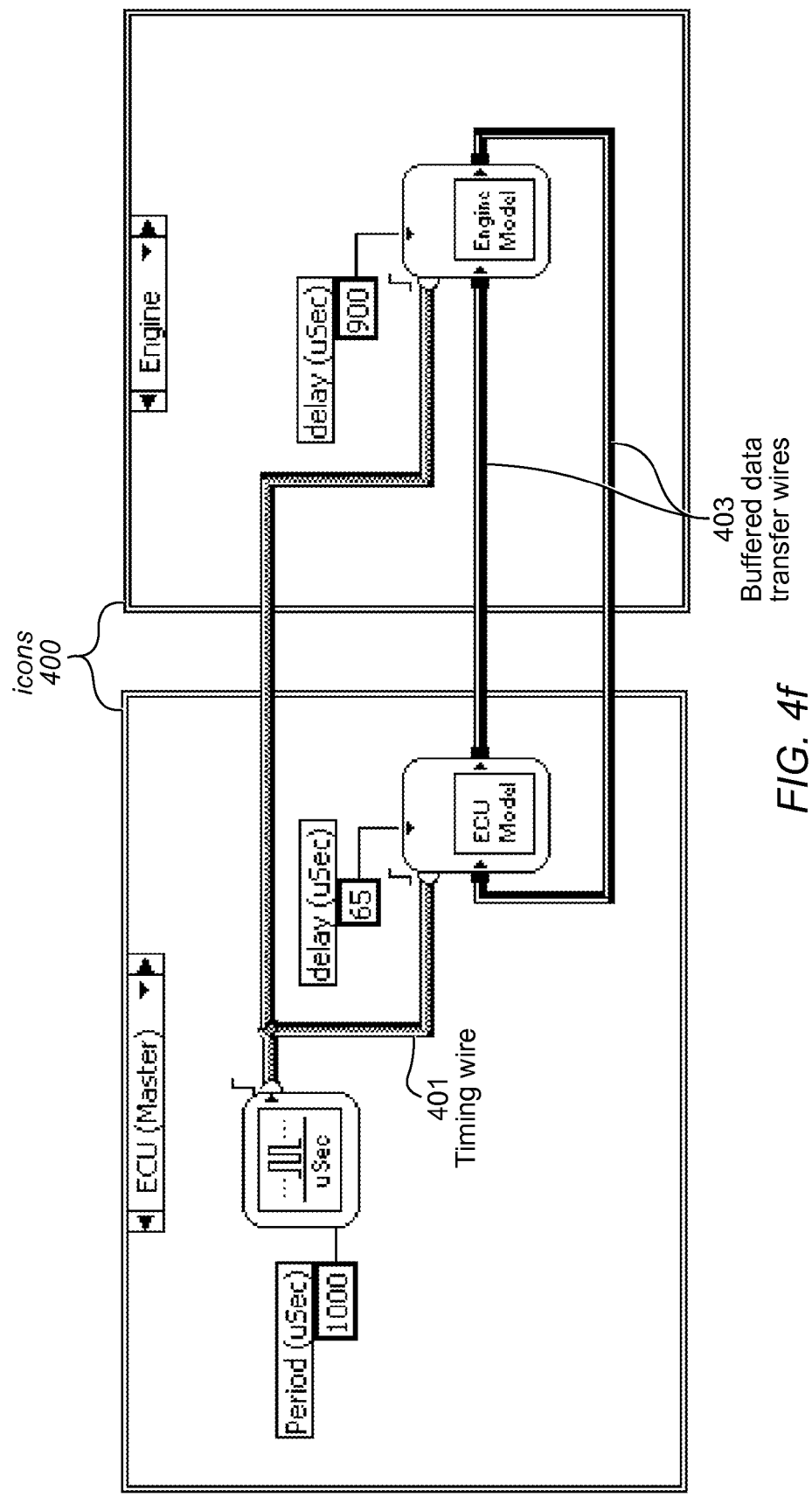

FIG. 4F is an example system diagram that is directed to a distributed modeling according to one embodiment. More specifically, the system diagram of FIG. 7F specifies or implements a system where respective models are targeted for respective execution on two execution targets, as specified by respective icons 400 (e.g., execution target icons) labeled "ECU (Master)" and "Engine".

As may be seen, the ECU (Master) icon contains a clock node, labeled uSec and displaying a clock signal symbol, which is configured to generate clock signals with a period of 1000 us (microseconds), and which may provide the clock signals to an ECU Model node, so labeled, via a timing wire (with a specified delay of 65 us) 601. The ECU Model node represents or includes an ECU model that simulates or emulates an engine control unit, e.g., for controlling an engine.

The clock node represents the time-triggered network as a clock source and is used to configure the network to produce the desired cycle time. One benefit of this approach is that it may make mapping the application to another communications topology easier, i.e., modifying the application to execute on a different physical system or infrastructure than a time-triggered network. For example, one may wish to execute the application on two R Series cards plugged into the same PCI bus, or on two computers connected by an ordinary network. As another example, one may wish to run the ECU model on one core and the Engine Model on another core of a dual core CPU. Since the time-triggered app in the prior art example of FIG. 7G is so specific to running on a time-triggered network, to run that app on these other topologies, with the same timing, would require discarding most if not all of the original program and writing another one. In contrast, using the approach described herein, only the clock node has to be remapped.

As FIG. 4F also shows, the Engine icon includes an Engine Model node, so labeled, that represents or includes an engine model that simulates or emulates an engine, e.g., an internal combustion engine. Note that the clock node in the ECU (Master) icon is also coupled to the Engine Model node via a timing wire 401. The ECU Model node and the Engine Model node are connected via two buffered data transfer wires 403, thus forming a feedback loop, where the ECU Model node provides input to the Engine Model node, and the Engine Model node's output is provided back to the ECU Model node as input.

Figure 4G:
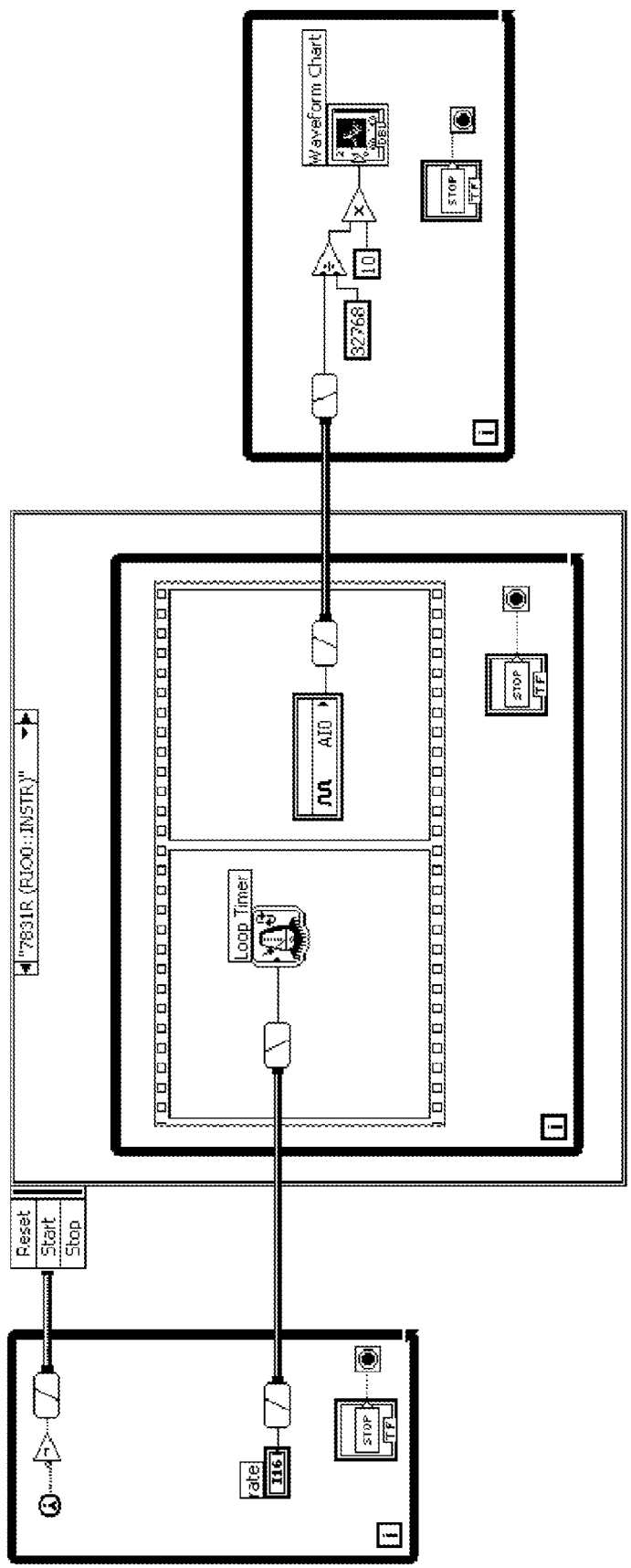

Finally, FIG. 4G illustrates a system diagram which includes dialogs for specification of procedures in the system as a whole. As shown on the target execution icon 7831R, a dialog including "Reset", "Start", and "Stop" may be displayed and may be wired to configure the respective resets, starts, and stops of the system. As shown, the 7831R device may begin execution upon receiving a signal via the wire connected to the "start" portion of the dialog. Additionally, FIG. 7G illustrates an implicit context for the graphical program portions on the left and right hand side of the system diagram. In this case, these graphical program portions may be executed by a controlling computer system.

Thus, FIGS. 4A-4G illustrate exemplary system diagrams.

Exemplary Physical Diagram

As described above, a physical diagram may refer to a diagram which indicates physical connectivity between physical devices in a system. For example, the physical diagram may visually indicate the connectivity of various physical devices in a measurement system, e.g., a computer connected to a measurement device via an Ethernet network. A physical diagram may show how executable functionality (e.g., of a graphical program or system diagram) is implemented in the real world. Thus, in primary embodiments, the physical diagram includes a plurality of interconnected icons, where each icon in the physical diagram corresponds to a physical device. Additionally, following these embodiments, connections between the icons in the physical diagram represents physical connectivity. For example, the wires between the icons in the physical diagram may represent Ethernet cables, USB connections, Firewire connections, and/or other physical media which connects devices in the system. In some embodiments, physical diagrams (and/or system diagrams) may also be useful for visualizing variable, channel, or network relationships among devices in the system. Note that a certain type of wire may also be used to represent a wireless connection.

Note that in some embodiments, configuration diagrams may have a similar appearance and/or use as physical diagrams. However, configuration diagrams may refer to diagrams which are not linked to physical reality as are physical diagrams. For example, one or more of the devices in a configuration diagram may not be physically present in the system (e.g., it may be simulated or implement on other devices in the system). Thus, physical diagrams represent physical components and physical connectivity of a system and configuration diagrams may represent physical components and/or virtual (or desired) components.

In some embodiments, the physical diagrams/configuration diagrams may be automatically populated or created by performing a discovery process. For example, the development environment may automatically discover all coupled devices as well as the connectivity between the devices. Correspondingly, all of the physical devices may be displayed in the physical diagram/configuration diagram. Discovery may include not only the connectivity and presence of devices, but also their identities, configurations, available resources, and/or other characteristics.

An exemplary physical diagram is shown in the bottom portion of FIGS. 5A and 5B (described in more detail below).

Figure 5A:
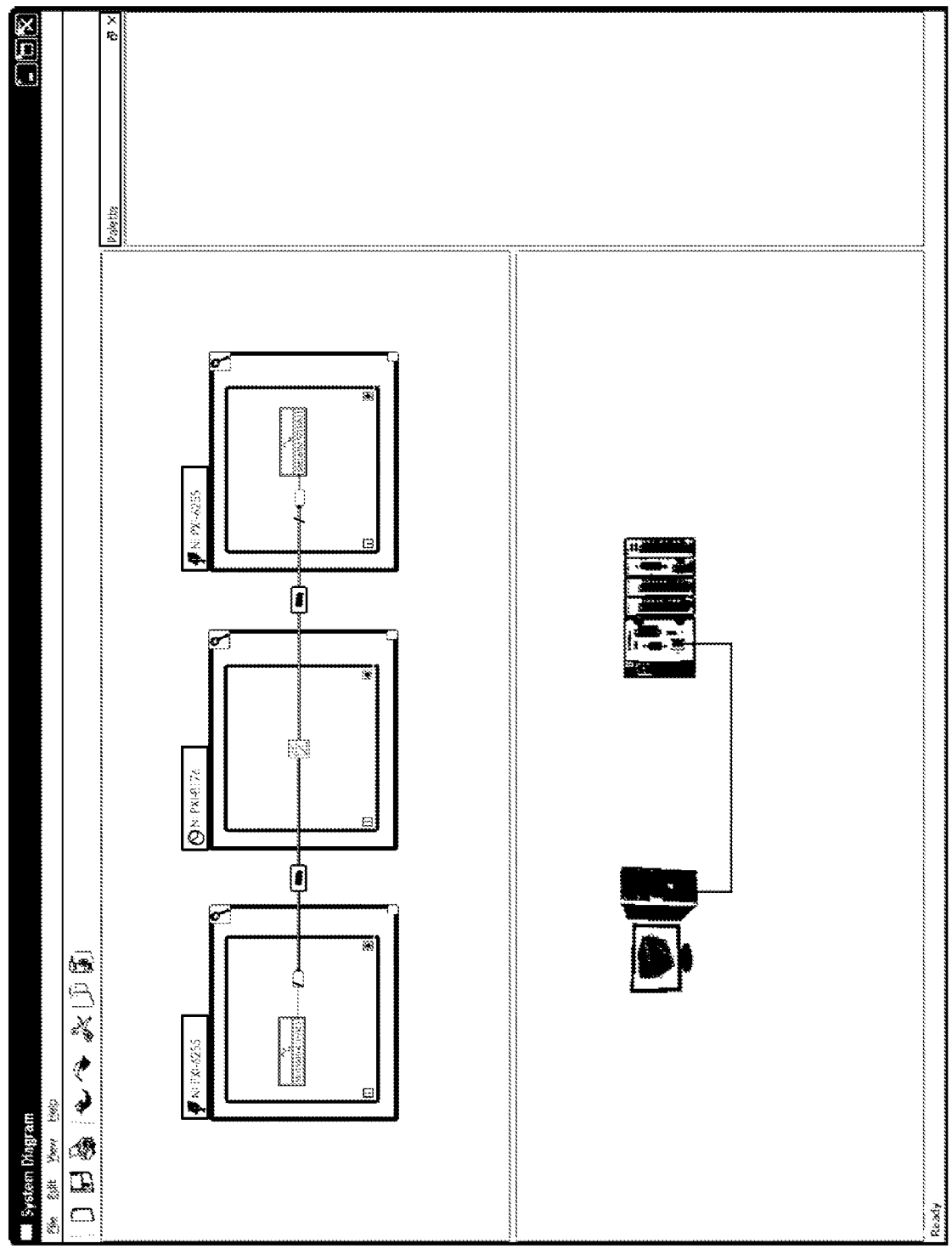
FIGS. 5A and 5B are screen shots of a split view of a system diagram and a physical diagram according to one embodiment.
Figure 5B:
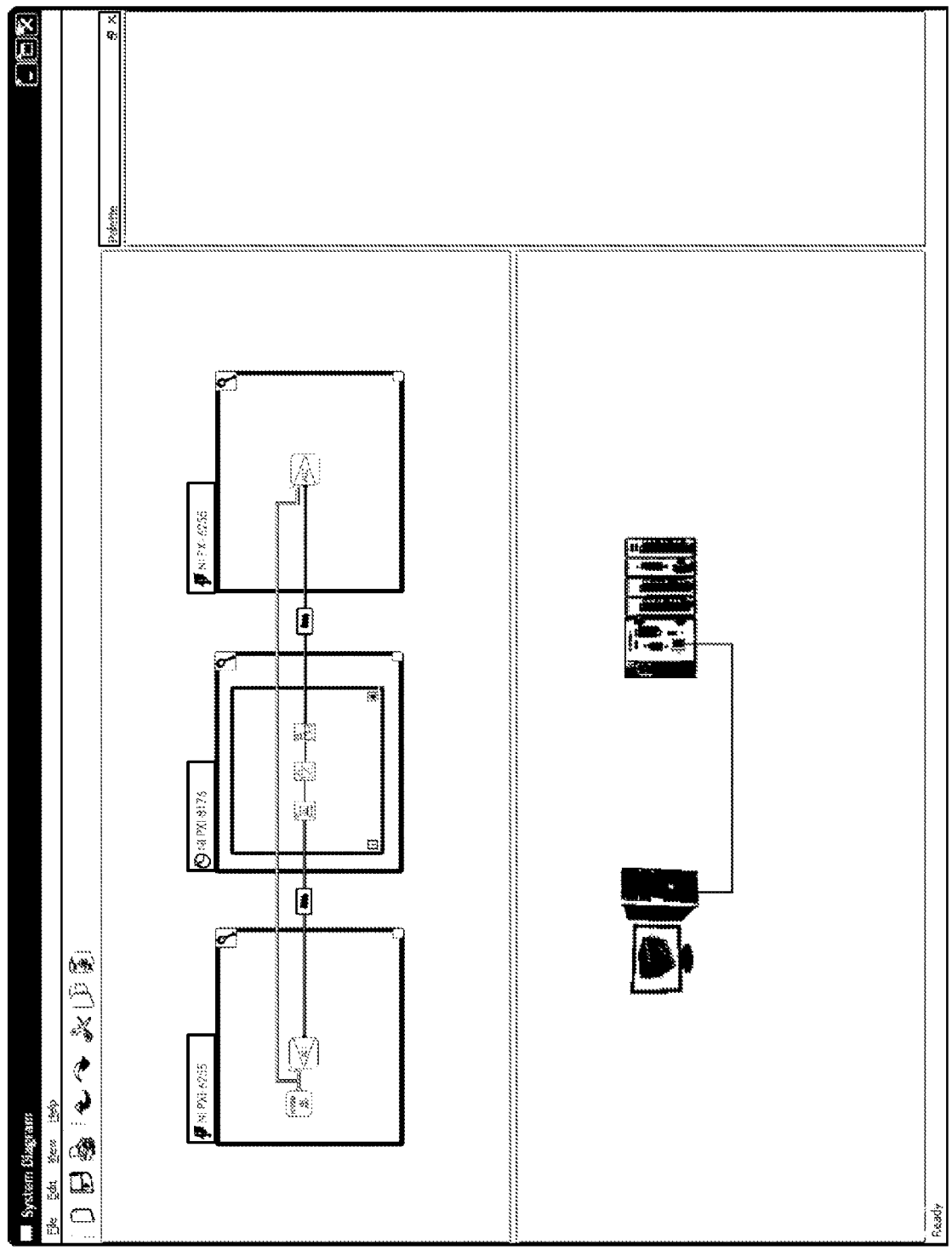

FIGS. 5A and 5B—Synergy of Multiple Diagrams

In some embodiments, it may be desirable to display or use multiple diagrams. For example, graphical programs may allow users to see a logical view of a system. Similarly, system diagrams may provide an easy and intuitive means for visualizing the logical view of a systems as well as locations of execution and relationships between other physical or virtual devices of the system. Thus, a system diagram may allow a user to easily understand functionality and logical flow of execution over an entire system. Physical diagrams and/or configuration diagrams, on the other hand, may allow users to view the physical components and connectivity of the physical components. Thus, each of the various diagrams may provide different views of a system.

In some embodiments, it may be desirable to allow a user to choose one or more of these diagrams or "views" of the system. For example, the user may want to see a purely logical view of a system. In this example, a graphical program may be displayed for the user, e.g., on the computer system 82. The graphical program may be displayed with or without graphical indications (e.g., target execution icons or configurable device icons) which visually indicate where portions of the graphical program are executed. Alternatively, the user may desire a system view of the system where both logical elements and execution indications are displayed. Additionally, the system view may include icons representing hardware devices (e.g., processing elements or configurable elements) that may not be present in the graphical programs. Finally, the user may want to view a physical representation of the system; correspondingly, the physical diagram may be displayed on the display of the computer system 82.

In some embodiments, the multiple diagrams or views may each take up the entirety of the display. Thus, the user may, in one embodiment, toggle between the different views. Alternatively, the diagrams or views may be displayed in a "split view" where a plurality of diagrams or views are shown on the display, or the different diagram are shown separately and concurrently on multiple display devices. For example, in one embodiment, a split view may be displayed where a system diagram or graphical program is displayed in a top portion and the physical view (physical diagram) may be displayed on the bottom portion. In another example, in one embodiment, a split view may be displayed where a system diagram or graphical program is displayed on a first display device and the physical view (physical diagram) may be displayed on a second display device. This may be especially useful for conveying overall system information to the user. Thus, in one embodiment, the user may see a logical view of the system which may or may not indicate where logical elements execute as well as a physical view of the system allowing intuitive understanding of the entire system in one view.

In some embodiments, the development environment may allow the user to see correlations between the logical view and the physical view. For example, following the split view embodiment from above, a user may be able to select a physical component in the physical view and corresponding graphical indications in the logical view may be visually modified to indicate where graphical program portions execute. For example, the user may select a computer system in the physical view and one or more target execution icons (or possibly icons comprised in the target execution icons themselves) may "pop" (e.g., appear to jump or bounce on the screen), change colors, become highlighted, marching ants, and/or otherwise be visually indicated. Similarly, the user may select various components in the logical view and corresponding hardware devices in the physical view may be highlighted or visually indicated. Thus, the user may easily discern which logical elements in the system diagram or graphical program correspond to the physical devices shown in the physical diagram.

Additionally, the user may be able to associate elements in the physical view with elements in the logical view or vice/versa. For example, the user may select a physical device in the physical diagram and invoke creation of an icon in the system diagram/graphical program. In one embodiment, the user may simply select one of the device and drag that device into the system diagram to invoke creation of an icon (e.g., an execution target icon or configurable device icon) in the system diagram which corresponds to that device. Alternatively, the user may select various logical elements or nodes in the system diagram and associate those icons or nodes with the devices in the physical diagram. As one example, the user may select one or more icons (e.g., a graphical program portion) in the system diagram and associate the icons with a device in the physical diagram (e.g., by dropping the icons on the device). Correspondingly, a new target execution icon or configurable icon (among others) that is associated with the device may be displayed in the system diagram with the one or more icons. Additionally, the target execution icon or configurable icon may be displayed according to connectivity of the device in the system, if desired.

As shown, FIGS. 5A and 5B illustrate exemplary split views of a system diagram and a physical diagram. Note that these Figures correspond to the system diagrams illustrated in FIGS. 4B-4E. As shown in 5A, the top portion illustrates the system diagram of FIG. 4B and the bottom portion shows the physical connectivity between the two devices of the system (in this case from a port of a chassis to a computer). More specifically, FIG. 5A depicts a data streaming application where data is read from the PXI-6255, streamed over DMA to the PXI-8176, which after modifying the data, streams data back to the PXI-6255 to be output. The FIFO affordance of the wire is used as an access point for configuring buffering policies for the configurable wire. This Figure also illustrates the concept that a single physical device (in this case the PXI-6255) can have multiple logical representations Similarly, FIG. 5B shows the same split view with an expanded system diagram (from FIG. 4C). Thus, FIGS. 5A and 5B show exemplary split views of a system diagram and physical diagram.

Figure 6A:
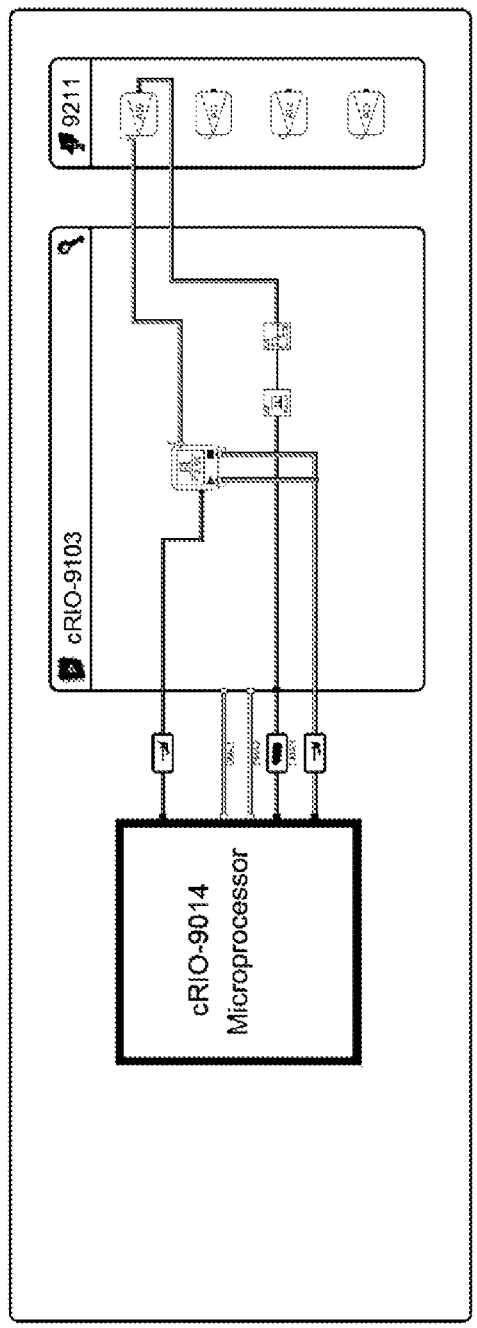
FIGS. 6A and 6B are screen shots of a composite view of a system diagram and a physical diagram according to one embodiment.
Figure 6B:
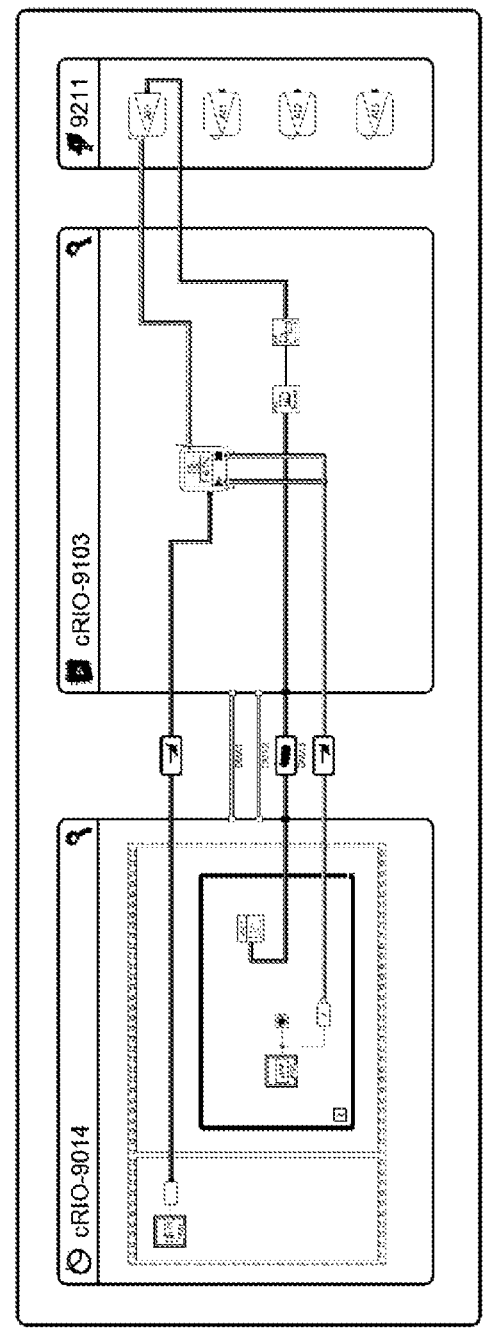

Note that the above described views are exemplary only and that other views are contemplated. For example, in some embodiments, there may be a single view, e.g., of a system diagram, where all physical and logical connectivity is indicated. Thus, in these embodiments, the user may easily understand the entirety of the system. FIGS. 6A and 6B illustrate exemplary diagrams of this case. As shown in FIG. 6A, the cRIO-9014 Microprocessor is connected to cRIO-9103 which is connected to 9211. In this case, instead of separating the logical components of the cRIO-9014 and cRIO-9103 separate target execution icons, the physical and logical relationship is shown in a single view. Similarly, FIG. 6B shows this single view, but also shows the logic of the cRIO-9014. Note that in various embodiments, the user may switch between any of the views/diagrams described above, as desired. Additionally, the user may choose to "morph" any available view to another view. For example, the user may be viewing a physical diagram of the system and may invoke a "morph" or graphical change in the diagram to a different view, such as the combined view described above. Further embodiments related to morphing or transitioning between views are described below. Alternatively, the user may invoke a conversion of the physical diagram to a logical view or system diagram, as desired. Note that these views/changes are exemplary only and that others are envisioned.

Alternatively, or additionally, more than two diagrams may be shown simultaneously. For example, two or more of a physical diagram, a configuration diagram, a system diagram, and/or a graphical program (among other diagrams) may be displayed at the same time. In some embodiments, various ones of the diagrams may be overlaid in an intelligent manner, to convey an intuitive understanding of the system to the user. For example, when two or more diagrams are overlaid, corresponding nodes or icons in the different diagrams may be shown in the same position on the display to indicate correspondence. In one embodiment, a diagram may be automatically modified to allow this correspondence to be readily displayed. Thus, the above described views are exemplary other, and other views are envisioned.

In one embodiment, one or more of the above described diagrams may be used for mapping system configurations to existing system configurations. For example, in one embodiment, the user may wish to map a diagram (e.g., containing specified physical and logical elements) to an existing (physical) system. For example, the existing diagram may have physical components (e.g., devices) which differ from the user's existing (physical) system. The development environment may be able to map the diagram (e.g., automatically) to the existing system and/or simulate the missing devices that are indicated in the diagram. Thus, diagrams may be mapped onto real systems by transferring functionality to existing systems or via simulation of the missing components (among others).

Thus, FIGS. 3A-6B illustrate exemplary diagrams/views of systems. The following sections describe configuration and display of data transfer functionality in the various diagrams described above (among others).

Figure 7:
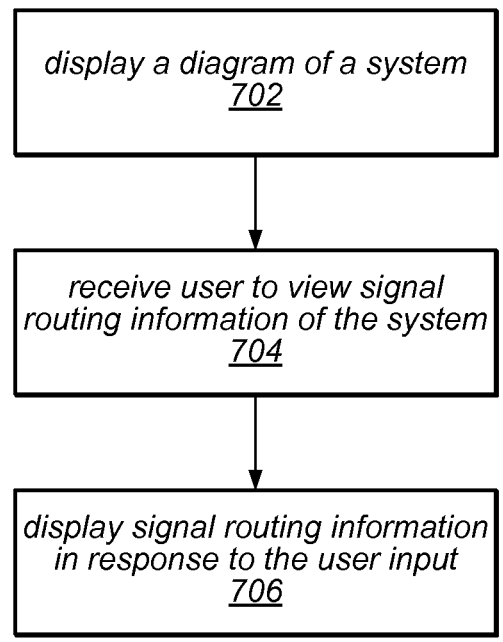
FIG. 7 is a flowchart diagram illustrating one embodiment of a method for displaying physical signal routing in response to selection of a logical connection.

FIG. 7—Displaying Physical Routing in Response to Selection of a Logical Connection FIG. 7 illustrates a computer-implemented method for displaying physical signal routing in response to selection of a logical connection. The method shown in FIG. 7 may be used in conjunction with any of the computer systems or devices shown in the above Figures, among other devices. In various embodiments, some of the method elements shown may be performed concurrently, performed in a different order than shown, or omitted. Additional method elements may also be performed as desired. As shown, this method may operate as follows.

Initially, in 702, a diagram of a system may be displayed. The system may be similar to those described above. For example, the system may include a plurality of physical components connected via physical connections as well as a plurality of logical components (e.g., software) implemented on various ones of the physical components (e.g., devices or components within devices).

Additionally, the diagram may be similar to those described above, such as the system diagram, a diagram having multiple views, etc. More specifically, the diagram may include a plurality of icons connected by wires. The icons may represent various components of the diagram. For example, a first subset of the icons represent the plurality of logical elements of the system and wires between the first subset of icons may represent logical connections between them. The logical connection may indicate that there is data or signals passed between the respective logical components. For example, the logical connection may be a dataflow or buffered connection between the two logical elements. Additionally, the diagram may include a second subset of icons that represent physical components of the system. In some embodiments, these icons may be connected together via wires. Accordingly, the wires may represent physical connections between the physical components, e.g., cables or physical signal routes between the physical components. In some embodiments, icons representing the logical elements may be displayed within an interior portion of icons representing the physical components on which the logical elements are implemented.

However, it should be noted that the system may be a virtual system (e.g., which is being designed, but is not yet implemented) or may be an actual, "real" system (e.g., where the devices are present and connected in the manner shown in the diagram). Even in cases where the system is virtual, the diagram still represents both physical components and logical elements. In other words, even though the physical components of the system may be virtual, they are still distinct from the logical elements of the system. For example, for a virtual system, the diagram indicates that these logical elements would be or will be implemented on the indicated physical components.

In 704, user input may be received to view signal routing information (or physical routing information) of the system.

The user input may be received to view the signal routing information for the entire system, for a portion of the system (e.g., by selecting the portion of the system in the diagram), for a specific device or physical component in the system (e.g., by selecting the specific device or physical component), for one or more logical connections in the system, etc. For example, the user may provide input to a user interface to request to show signal routing information, e.g., at a diagram or system level. As another example, the user may select a specific logical connection (e.g., by selecting its corresponding wire) and/or select an option to view the signal routing information associated with the logical connection. In one embodiment, the user may simply select the wire without providing further user input.

As another example, the user may select a plurality of wires for viewing signal routing information. Alternatively, or additionally, the user may select one or more icons representing physical components of the system to view corresponding signal routing information of those physical components. Further, the user may select a plurality of icons in the diagram to view all signal routing information associated with those icons. Thus, the user may request signal routing information for all or any portion of the system, e.g., via user input to the diagram representing the system.

In some embodiments, the user input may be received via gestures, such as touch gestures received to a touch interface, such as a touch display. However, other types of user input are also envisioned, e.g., using a mouse, keyboard, etc. The type of signal routing information that is displayed in 706 below may be determined on where the user input is received. For example, a gesture received to a specific wire may correspond to the user requesting information for that logical connection whereas a gesture received to the diagram at large may correspond to a user requesting signal routing information for the diagram or system at large.

Accordingly, in 706, signal routing information may be displayed in response to the user input in 704. The specific signal routing information may vary depending on the particular user input received. For example, where the user selects or requests signal routing information for a specific logical connection, the signal route of the data provided in the logical connection over a physical connection may be displayed or highlighted. In one embodiment, the signal routes or physical connections of the system may already be shown (e.g., in the diagram or outside of the diagram, as desired) and visually indicating the signal route may include highlighting the signal route corresponding to the logical connection. In another embodiment, signal routes may not have been shown before the user input and the signal route corresponding to the logical connection may be displayed in response to the user input.

Displaying a signal route may include displaying a graphical representation of the signal route in the diagram. Note that a signal route corresponding to a logical connection or wire may include a plurality of physical components and physical connections. For example, the signal route that is used to convey data between two logical components may require transmission over multiple devices, switches, muxes, cables, trace routes, etc. The signal route may be within a single device, between two devices, over a plurality of devices, etc. In some embodiments the displayed signal route may only show the required physical components and physical connections for the selected logical connection. Alternatively, signal routes within all related physical components may be displayed. For example, where the signal route corresponds to a connection between two cards in a chassis, e.g., via a backplane, other signal routes within the backplane may also be shown, even though they may not be involved in the specifically selected logical connection.

In addition to displaying the signal route, further information may be displayed. For example, bandwidth information, such as the required bandwidth for the logical connection and the estimate bandwidth of the current physical connection/signal route may be displayed. Other characteristics of the signal route may be displayed, such as communication protocol, the nature of the physical connection (e.g., cable type, distance, etc.), and/or other characteristics may be provided. Note that these characteristics may have been previously specified (e.g., by a user or specification associated with the physical components) or they may be automatically determined. In some embodiments, the characteristics may be automatically determined using the methods described in U.S. Pat. No. 7,650,316, which was incorporated in its entirety above.

Where the received user input relates to a portion of the system, or to the entire diagram or system, displaying the signal routing may involve displaying all available signal routes, signal routes that have corresponding logical connections in the diagram, etc. The signal routes may be displayed within the diagram or separately (e.g., in another diagram), as desired. Similar to above, characteristics of individual signal routes, groups of signal routes, etc. may be displayed in the diagram, e.g., in aggregate or per signal route.

In some embodiments, the user may be able to modify the signal route once it is displayed. For example, the user may view the current signal route (e.g., which may have been automatically determined) and modify it to a different signal route. This may be particularly beneficial where more than one route is possible for a physical connection. For example, a first physical component (implementing a first logical element) may be coupled to a second physical component (implementing a second logical element) via two different intervening pathways (such as via two different physical components). The user may be able to view the current signal route, e.g., using a first intervening component, and then modify it to use the other intervening component. Additionally, the user may be able to modify the configuration of the system in order to allow for a more efficient signal route, e.g., by moving cards to different slots within a chassis, as described below, adding a new physical element, changing connections between physical elements, etc.

FIGS. 8A-8D—Exemplary Figures Correspond to the Method of FIG. 7

FIGS. 8A-8D are exemplary Figures corresponding to displaying signal routing information in a diagram of a system. While these Figures correspond to the method of FIG. 7, they are exemplary only and are not intended to limit the scope of the methods described herein.

Figure 8A:
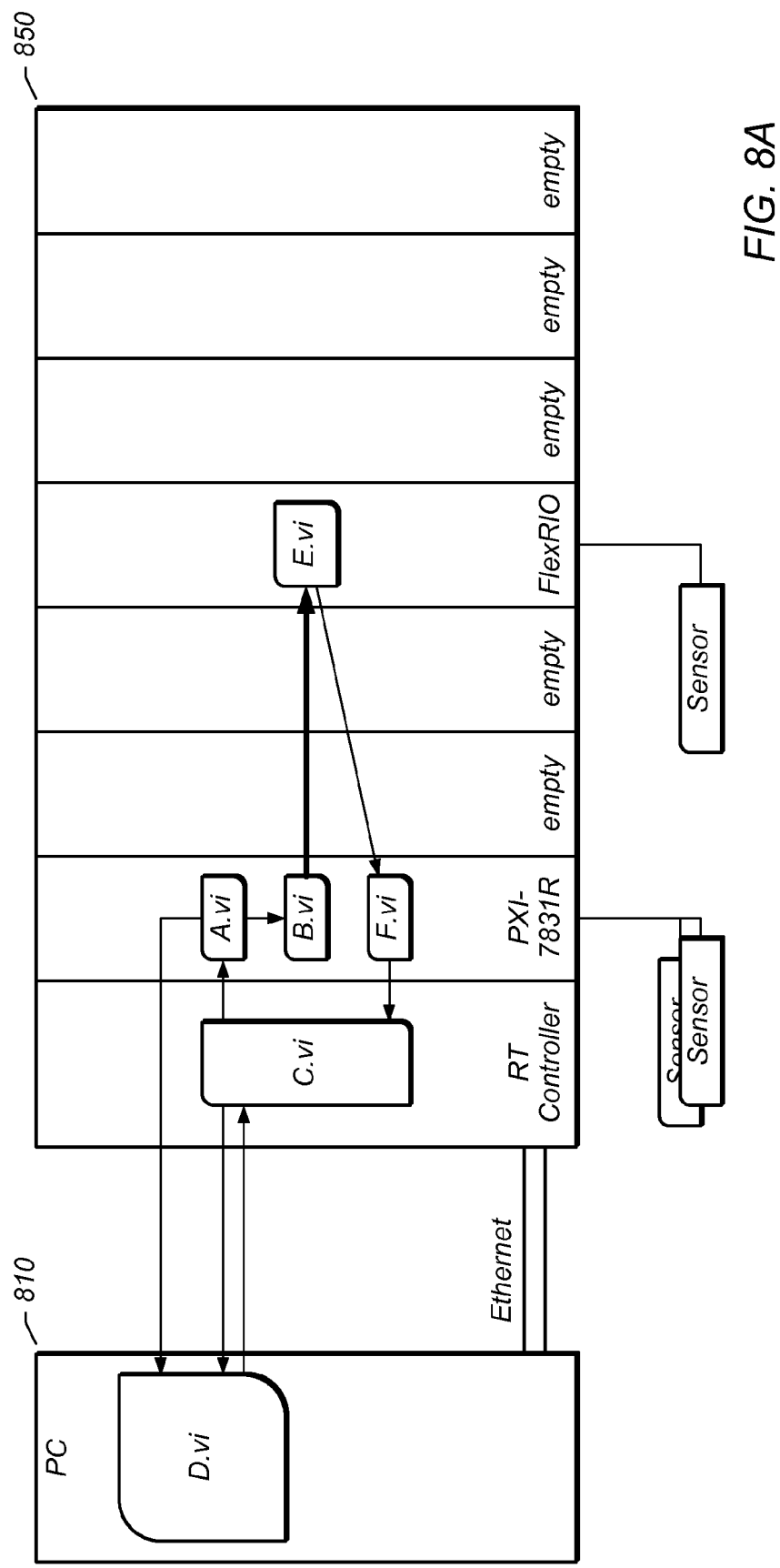

FIG. 8A illustrates an exemplary diagram of a system. In this diagram, a PC 810 is coupled to a chassis 850. In this particular diagram, multiple logical elements are deployed on the physical elements of the system. More specifically, the logical element "D.vi" (e.g., a graphical program) is deployed on the PC 810. Additionally, the chassis 850 includes multiple slots where devices or cards can be inserted, such as the "RT Controller" which is configured according to the "C.vi" logical element, the "PXI-7831R" which is configured according to the connected logical elements "A.vi", "B.vi", and "F.vi", and the FlexRIO which is configured according to the logical element "E.vi". The wires between these logical elements represent logical connections. Additionally, within the diagram of FIG. 8A, wires also represent physical connections. For example, as shown, the PC 810 and the chassis 850 are connected by an Ethernet connection. Additionally, sensors are connected to the PXI-7831R and FlexRIO devices via physical connections. However, in the embodiment of FIG. 8A, physical connections or signal routes are not shown between the devices within the chassis 850. In the embodiment of FIG. 8A, the user has selected the wire connecting the logical elements B.vi and E.vi between the PXI-7831R and the FlexRIO.

Figure 8B:
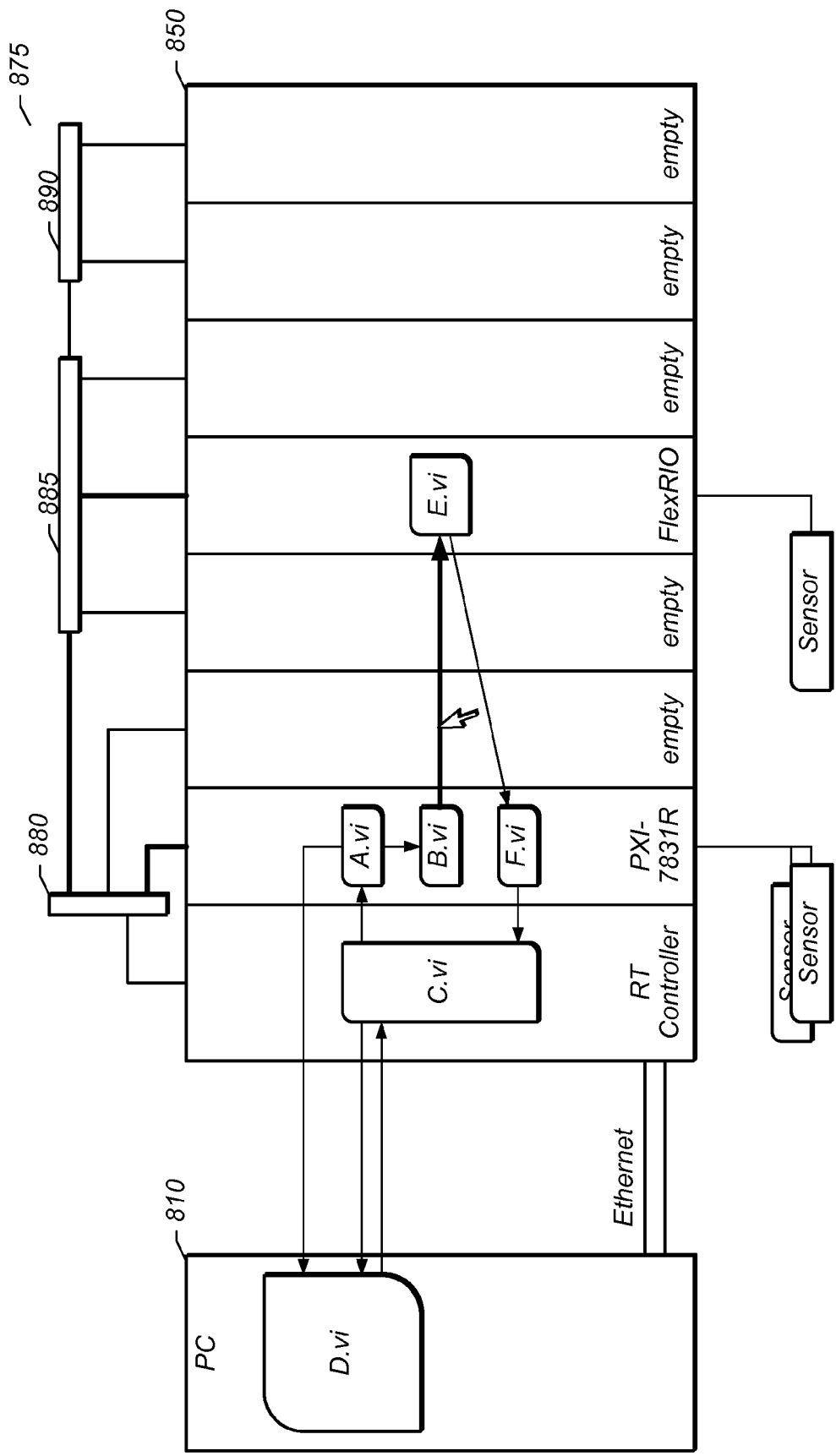

FIG. 8B illustrates an updated diagram that shows the signal route between the PXI-7831R and the FlexRIO. FIG. 8B may be automatically displayed in response to the user selecting the wire in FIG. 8A, in response selecting an option in a graphical user interface to view the signal route, in response to a gesture, e.g., provided to the wire in FIG. 8A, etc. In the diagram of FIG. 8B, the signal route between the PXI-7831R and the FlexRIO is shown. More specifically, as shown by 875, additional physical elements and connections between the physical elements have been added to the diagram, e.g., representing the backplane of the chassis 850. In this particular backplane, there is a mux or switch 880 which couples the RT controller to remaining slots in the chassis 850, a mux or switch 885 which couples three slots of the chassis 885, including the FlexRIO, to the mux or switch 880, and a mux or switch 890 which couples the last two slots to the mux or switch 885. Because the wire connecting B.vi to E.vi was selected in FIG. 8A, the signal route from PXI-7831R to mux or switch 880 to mux or switch 885 to the FlexRIO is highlighted. Thus, in response to user input in FIG. 8A, the signal route corresponding to the logical connection between B.vi and E.vi is visually indicated in the diagram of FIG. 8B. Note that in alternate embodiments, the additional physical elements and connections of 875 may already have been displayed in FIG. 8A, as desired.

In the diagram of FIG. 8C, additional information regarding the signal route is displayed. More specifically, the additional information includes bandwidth calculations. In this embodiment, the diagram environment may display the bandwidth required by the logical connection between the two logical elements B.vi and E.vi. In some embodiments, this requirement may be specified by the user. Alternatively, or additionally, the diagram environment may automatically determine the bandwidth required by analyzing the two logical elements B.vi and E.vi. For example, these software elements may have an associated frequency and amount of data that requires a minimum amount of data to be transferred per second and that amount of data may be automatically determined. In this particular instance, the required bandwidth is 500 MB/s. Further, the estimated bandwidth (e.g., average or maximum bandwidth) provided by the signal route may be displayed. Again, this bandwidth may have been previously specified (e.g., by a description of the chassis 850) or may be automatically determined. Automatic determination may be performed via calculations, e.g., by examining the specification of the chassis 850, the PXI 7831R, the FlexRIO, and/or any interceding elements, such as the switches 880, 885, 890, etc. Alternatively, the determination may be performed by actually performing a data transfer using the actual system and measuring the bandwidth. In this particular instance, the estimated maximum bandwidth is 200 MB/s, which is less than the required 500 MB/s. In some embodiments, the diagram environment may display a graphical indication that warns the user that a requirement has not been reached (e.g., by displaying the wire between B.vi and E.vi as broken or with a warning glyph).

In the diagram of FIG. 8D, the PXI-7831R has been moved from slot 2 to slot 4. Accordingly, the signal route between the two devices has been updated (from the PXI-7831R to the mux or switch 885 to the FlexRIO). In addition to the updated path, the additional information has been updated to indicate that the estimated maximum bandwidth is now 800 MB/s since the switch or mux 880 has been eliminated from the signal route. In some embodiments, the method may automatically suggest or perform such a modification to the diagram in order to address the bandwidth issue of FIG. 8C. Such an automatic suggestion or change may be invoked via a system diagram wizard for addressing any issues in the system.

Thus, FIGS. 8A-8D illustrate an exemplary diagram of a system for displaying signal routing within the system.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A non-transitory, computer accessible memory medium storing program instructions for displaying signal routing, wherein the program instructions are executable by a processor to:

display a diagram of a system, wherein the system comprises a plurality of physical components connected via physical connections, wherein the system comprises a plurality of software elements implemented on various ones of the physical components, wherein the diagram comprises a plurality of icons connected by wires, wherein at least a first subset of the icons represent the plurality of software elements of the system, wherein wires between the first subset of icons represent logical connections between corresponding software elements without representing corresponding physical signal routes;

receive user input requesting physical signal routing information of the system; and visually indicate a physical signal route corresponding to a first logical connection between a first software element and a second software element based on the user input, wherein the first software element is implemented on a first physical component and the second software element is implemented on a second physical component, wherein said visually indicating comprises displaying the physical signal route of a first physical connection between the first physical component and the second physical component.

2. The non-transitory, computer accessible memory medium of claim 1, wherein the user input selects a first wire representing the first logical connection, wherein said visually indicating the physical signal route is based on the user input selecting the first wire.

3. The non-transitory, computer accessible memory medium of claim 1, wherein the physical signal route corresponding to the first logical connection is not displayed prior to said receiving user input.

4. The non-transitory, computer accessible memory medium of claim 1, wherein said visually indicating the physical signal route comprises displaying a graphical representation of the physical signal route.

5. The non-transitory, computer accessible memory medium of claim 1, wherein the physical signal route comprises a plurality of physical components and physical connections between the physical components.

6. The non-transitory, computer accessible memory medium of claim 1, wherein the program instructions are further executable to:

visually indicate a physical signal route corresponding to a second logical connection between a third software element and a fourth software element in response to the user input.

7. The non-transitory, computer accessible memory medium of claim 1, wherein said visually indicating is performed within the diagram.

8. The non-transitory, computer accessible memory medium of claim 1, wherein the program instructions are further executable to:

visually indicate communication characteristics of the physical signal route.

9. The non-transitory, computer accessible memory medium of claim 1, wherein at least a subset of the software elements represent graphical programs, wherein each graphical program comprises a plurality of interconnected icons that visually indicate functionality of the graphical program, wherein the graphical program is executable to perform the functionality.

10. The non-transitory, computer accessible memory medium of claim 1, wherein the diagram comprises a second subset of icons corresponding to the plurality of physical components, wherein wires between the second subset of icons represent the physical connections between the corresponding physical elements.

11. A method for displaying signal routing, comprising:

displaying a diagram of a system, wherein the system comprises a plurality of physical components connected via physical connections, wherein the system comprises a plurality of software elements implemented on various ones of the physical components, wherein the diagram comprises a plurality of icons connected by wires, wherein at least a first subset of the icons represent the plurality of software elements of the system, wherein wires between the first subset of icons represent logical connections between corresponding software elements without representing corresponding physical signal routes;

receiving user input requesting physical signal routing information of the system; and visually indicating a physical signal route corresponding to a first logical connection between a first software element and a second software element based on the user input, wherein the first software element is implemented on a first physical component and the second software element is implemented on a second physical component, wherein said visually indicating comprises displaying the physical signal route of a first physical connection between the first physical component and the second physical component.

12. The method of claim 11, wherein the user input selects a first wire representing the first logical connection, wherein said visually indicating the physical signal route is based on the user input selecting the first wire.

13. The method of claim 11, wherein the physical signal route corresponding to the first logical connection is not displayed prior to said receiving user input.

14. The method of claim 11, wherein said visually indicating the physical signal route comprises displaying a graphical representation of the physical signal route.

15. The method of claim 11, wherein the physical signal route comprises a plurality of physical components and physical connections between the physical components.

16. The method of claim 11, further comprising:

visually indicating a physical signal route corresponding to a second logical connection between a third software element and a fourth software element in response to the user input.

17. The method of claim 11, wherein said visually indicating is performed within the diagram.

18. The method of claim 11, further comprising:

visually indicating communication characteristics of the physical signal route.

19. The method of claim 11, wherein at least a subset of the software elements represent graphical programs, wherein each graphical program comprises a plurality of interconnected icons that visually indicate functionality of the graphical program, wherein the graphical program is executable to perform the functionality.

20. The method of claim 11, wherein the diagram comprises a second subset of icons corresponding to the plurality of physical components, wherein wires between the second subset of icons represent the physical connections between the corresponding physical elements.

21. A non-transitory, computer accessible memory medium storing program instructions for displaying signal routing in response to selection of a logical connection, wherein the program instructions are executable by a processor to:

display a diagram of a system, wherein the system comprises a plurality of physical components connected via physical connections, wherein the system comprises a plurality of software elements implemented on various ones of the physical components, wherein the diagram comprises a plurality of icons connected by wires, wherein a first subset of the icons comprise physical component icons representing the physical components, wherein a second subset of the icons comprise software element icons representing the plurality of software elements of the system, wherein wires between the software element icons represent connections between corresponding software components without representing corresponding physical connections;

receive user input selecting a first wire between a first software element and a second software element; and visually indicate physical connectivity information corresponding to the first wire, wherein the first software element is implemented on a first physical component and the second software element is implemented on a second physical component, wherein said visually indicating comprises displaying the physical connectivity information of a first physical connection between the first physical component and the second physical component in the diagram.

22. The non-transitory, computer accessible memory medium of claim 21, wherein wires between the physical component icons represent physical connections between corresponding physical components.

23. The non-transitory, computer accessible memory medium of claim 21, wherein at least a subset of the software elements represent graphical programs, wherein each graphical program comprises a plurality of interconnected icons that visually indicate functionality of the graphical program, wherein the graphical program is executable to perform the functionality.

24. The non-transitory, computer accessible memory medium of claim 21, wherein the physical connectivity information corresponding to the first wire is not displayed prior to said receiving user input.

25. A method for displaying signal routing in a chassis in response to selection of a logical connection, comprising:

displaying a diagram of a system, wherein the system comprises a chassis having a backplane and a plurality of slots, wherein devices are positioned in at least two of the slots and are configured to communicate over the backplane, wherein the system comprises software elements implemented on each of the devices, wherein the diagram comprises a plurality of icons connected by wires, wherein a first subset of the icons comprise physical component icons representing the devices, wherein a second subset of the icons comprise software element icons representing the plurality of software elements of the system, wherein wires between the software element icons represent connections between corresponding software elements without representing corresponding physical connections;

receive user input selecting a first wire between a first software element and a second software element; and visually indicate physical connectivity information corresponding to the first wire, wherein the first software element is implemented on a first device and the second software element is implemented on a second device, wherein said visually indicating comprises displaying the physical connectivity information of the backplane connection between the first device and the second device in the diagram.

26. The non-transitory, computer accessible memory medium of claim 1, wherein each software element comprises one or more of:

a software element executable by a processor of a device; or a software element implemented on a programmable hardware element of a device.

* * * * *

UNITED STATES PATENT AND TRADEMARK OFFICE
CERTIFICATE OF CORRECTION

| | | |
|---|---|---|
| PATENT NO. | : 8,782,525 B2 | Page 1 of 1 |
| APPLICATION NO. | : 13/193133 | |
| DATED | : July 15, 2014 | |
| INVENTOR(S) | : Curtis et al. | |

It is certified that error appears in the above-identified patent and that said Letters Patent is hereby corrected as shown below:

Title page:

(73) Assignee:
please delete "Insturments" and substitute -- Instruments --.

Signed and Sealed this
Thirtieth Day of September, 2014

Michelle K. Lee
*Deputy Director of the United States Patent and Trademark Office*